US009750145B2

United States Patent
Little et al.

(10) Patent No.: US 9,750,145 B2
(45) Date of Patent: Aug. 29, 2017

(54) ENCLOSURE HAVING RECONFIGURABLE WIRING COMPARTMENTS

(71) Applicant: SunPower Corporation, San Jose, CA (US)

(72) Inventors: Kristine Little, Austin, TX (US); William John Morris, Round Rock, TX (US)

(73) Assignee: SunPower Corporation, San Jose, CA (US)

( * ) Notice: Subject to any disclaimer, the term of this patent is extended or adjusted under 35 U.S.C. 154(b) by 116 days.

(21) Appl. No.: 14/941,401

(22) Filed: Nov. 13, 2015

(65) Prior Publication Data

US 2017/0034931 A1    Feb. 2, 2017

Related U.S. Application Data

(60) Provisional application No. 62/197,497, filed on Jul. 27, 2015.

(51) Int. Cl.
| | |
|---|---|
| *H05K 5/00* | (2006.01) |
| *H05K 5/02* | (2006.01) |
| *H05K 7/14* | (2006.01) |
| *H02S 40/30* | (2014.01) |

(52) U.S. Cl.
CPC .......... *H05K 5/0026* (2013.01); *H02S 40/30* (2014.12); *H05K 5/0217* (2013.01); *H05K 5/0247* (2013.01); *H05K 7/14* (2013.01)

(58) Field of Classification Search
CPC .. H05K 5/0247; H05K 5/0217; H05K 5/0026; H02B 1/26; H02B 1/30; H02B 1/305; H02B 1/306
USPC .......................................... 361/622, 627, 641
See application file for complete search history.

(56) References Cited

U.S. PATENT DOCUMENTS

| 6,242,697 B1 | 6/2001 | Gerken et al. |
| 2013/0094151 A1 | 4/2013 | Escamilla et al. |
| 2013/0137358 A1 | 5/2013 | Manahan et al. |

FOREIGN PATENT DOCUMENTS

| EP | 0681424 B1 | 8/1998 |
| WO | WO 2012-127209 A2 | 9/2012 |

*Primary Examiner* — Hoa C Nguyen
*Assistant Examiner* — Keith Depew
(74) *Attorney, Agent, or Firm* — Schwabe, Williamson & Wyatt P.C.

(57) ABSTRACT

Enclosures having reconfigurable compartments for routing wiring used to monitor photovoltaic system output are described. In an example, an enclosure includes a housing around a circuitry bay and a wiring bay, and the wiring bay contains movable shrouds and/or partitions to divide the wiring bay into several reconfigurable wiring compartments. High-voltage wiring and low-voltage wiring may be routed through the wiring compartments, and the shrouds and/or partitions may physically and electrically isolate the high-voltage wiring from the low-voltage wiring. A tray disposed in the circuitry bay and include antenna mounts that extend into the wiring bay to isolate antennas mounted on the antenna mounts from electromagnetic interference from electronic components within the circuitry bay.

20 Claims, 20 Drawing Sheets

ENCLOSURE HAVING RECONFIGURABLE WIRING COMPARTMENTS

RELATED APPLICATIONS

This application claims the benefit of priority from U.S. Provisional Patent Application Ser. No. 62/197,495 filed on Jul. 27, 2015, the full disclosure of which is incorporated herein by reference.

BACKGROUND

Photovoltaic cells, commonly known as solar cells, are well known devices for converting solar radiation into electrical energy. Solar cells can be assembled into photovoltaic arrays, which may be used to convert sunlight into electricity. The electricity produced by the photovoltaic arrays may be transmitted by cables for residential and/or commercial use.

Information about the electrical energy generated by photovoltaic arrays, e.g., a rate and/or quantity of power produced, may be used to optimize performance of the photovoltaic arrays. To this end, photovoltaic systems may include power monitoring components to measure power output and to communicate data representing the measurements to external devices, such as networked computer devices. Power monitoring components may be stored in an enclosure that is mounted near the photovoltaic arrays, e.g., on the outside of a home or office that uses the power produced by the photovoltaic arrays. High-voltage power may be routed into and through the enclosure using high-voltage wiring that electrically connects the enclosure with the photovoltaic arrays and/or a power grid. Low-voltage power may be routed into and through the enclosure using low-voltage wiring that connects with, e.g., external communications electronics.

DETAILED DESCRIPTION

Figure 1:
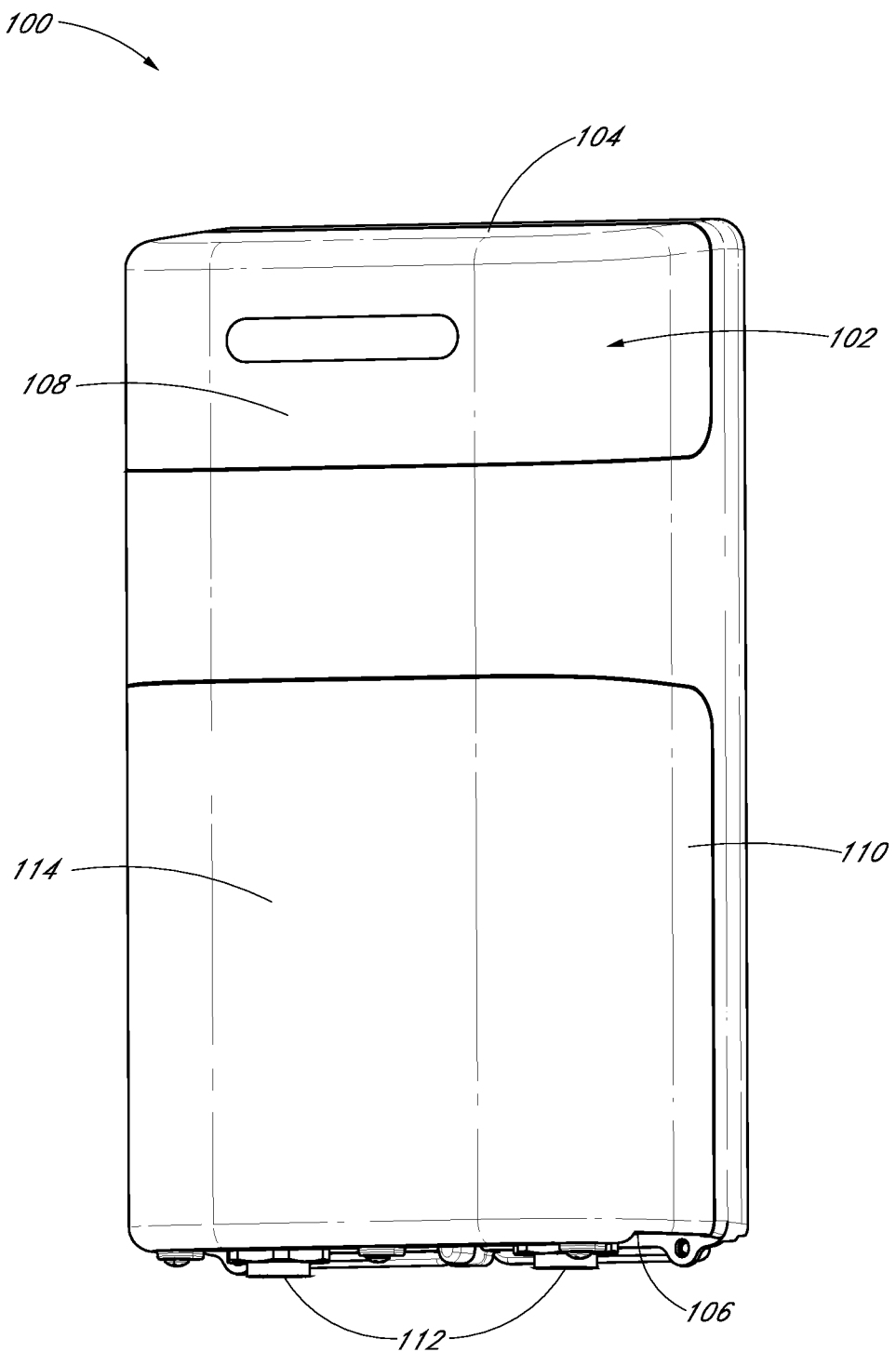
FIG. 1 illustrates a perspective view of an enclosure containing components to monitor power output of photovoltaic arrays, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" location does not necessarily imply that this location is the first location in a sequence; instead the term "first" is used to differentiate this location from another location (e.g., a "second" location).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," "below," "in front of," and "behind" refer to directions in the drawings to which reference is made. Terms such as "front," "back," "rear," "side," "outboard," "inboard," "leftward," and "rightward" describe the orientation and/or location of portions of a component, or describe the relative orientation and/or location between components, within a consistent but arbitrary frame of reference which is made clear by reference to the text and the associated drawings describing the component(s) under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Existing enclosures have fixed routing of high-voltage and low-voltage wiring, i.e., an installer has no control over the path taken by the wiring between an egress point in the enclosure and a corresponding electrical connector within the enclosure. Thus, during installation of the wiring, high-voltage and low-voltage wiring may need to be crossed or overlapped outside of the enclosure. Furthermore, it may be necessary to strain or sharply bend the wiring within the enclosure to make the wiring conform to the fixed cabling route.

In an aspect, an enclosure includes reconfigurable compartments for routing wiring used to monitor photovoltaic system output. The compartments may be configured such that high-voltage wiring and low-voltage wiring may be routed from any of several selectable openings in an enclosure wall, and thus, the high-voltage wiring may exit toward a photovoltaic array and the low-voltage wiring may exit toward external communications electronics. Accordingly, cross-over and/or overlap of the high-voltage and low-voltage conduit outside of the enclosure may be avoided, resulting in a clean and attractive aesthetic.

In an aspect, an enclosure includes reconfigurable compartments having several shrouds and/or partitions that can be inserted and removed from a wiring bay. The shrouds may be removed from the wiring bay to maximize the usable space within the wiring circuitry during installation of high-voltage wiring. After installing the high-voltage wiring, the shrouds may be replaced in the wiring bay over the high-voltage wiring and the low-voltage wiring may be installed above the shrouds. Thus, there may be ample room to install the wiring in the wiring bay. Accordingly, installation may be performed quickly and easily. Furthermore, the wiring may be routed from an upper end of the wiring bay to a lower end of the wiring bay without requiring the wiring to be excessively strained in order to avoid routing over other wiring.

In an aspect, an enclosure includes reconfigurable compartments having shrouds and/or partitions that can be moved to route wiring from an electrical connector on one side of a wiring bay to a cable opening on another side of the wiring bay along a customizable path. For example, when a high-voltage electrical connector is located on a left side of the wiring bay, several shrouds may be positioned to route a high-voltage wire from the high-voltage electrical connector to a cable opening on a left side or a right side of the wiring bay. Accordingly, wiring may be routed along one of several selectable paths at the discretion of the installer.

In an aspect, an enclosure includes a tray for supporting one or more electronic components and/or circuitry. For example, the tray may support a printed circuit board having electronic components and/or one or more antennas. The tray may be mounted in the circuitry bay over another printed circuit board to allow the printed circuit boards to be stacked. Thus, a lateral dimension of the circuitry bay orthogonal to the stacking direction may be reduced as compared to a mounting configuration that includes printed circuit boards mounted side-by-side in the circuitry bay. Furthermore, the tray may support the antennas within the wiring bay, e.g., the antennas may be mounted between the antenna mounts extending into the wiring bay and a housing of the enclosure. Thus, the tray may shield the antennas from electromagnetic interference from a power supply located in the circuitry bay.

The aspects described above may be realized by the enclosures disclosed herein. In the following description, numerous specific details are set forth, such as specific material regimes and component structures, in order to provide a thorough understanding of embodiments of the present disclosure. It will be apparent to one skilled in the art that embodiments of the present disclosure may be practiced without these specific details. In other instances, well-known fabrication techniques or component structures, such as specific types of connectors or techniques for installing wiring, are not described in detail in order to not unnecessarily obscure embodiments of the present disclosure. Furthermore, it is to be understood that the various embodiments shown in the figures are illustrative representations and are not necessarily drawn to scale.

By way of summary, disclosed herein are enclosures having reconfigurable wiring compartments. In an embodiment, an enclosure includes a housing around a circuitry bay and a wiring bay, and a front wall of the housing covers the circuitry bay. A front opening may be formed in the front wall over the wiring bay to permit access to the wiring bay by an installer. A main shroud and a modular shroud may be disposed in the wiring bay to create reconfigurable compartments within the bay. For example, the main shroud may separate a front compartment from a rear compartment. Similarly, the modular shroud may separate a lateral compartment from an adjacent compartment. The modular shroud may be mounted on the main shroud in several different locations to reposition the lateral compartment and reconfigure the location of the lateral compartment in relation to the adjacent compartment. More particularly, the modular shroud may be movable to adjust a position of the lateral compartment relative to the adjacent compartment, e.g., either rightward or leftward of the adjacent compartment. In an embodiment, a partition separates the rear compartment behind the main shroud from the adjacent compartment. The partition may be moved to different locations corresponding to the mounting location of the modular shroud. For example, when the modular shroud is positioned on a left side of the wiring bay, the partition may be positioned on a right side of the wiring bay. The partition may be hinged to a base of the housing such that the partition swings between the different locations.

In an embodiment, several high-voltage electrical connectors and several low-voltage electrical connectors are disposed between the circuitry bay and the wiring bay. The low-voltage electrical connectors may be positioned in front of the high-voltage electrical connectors. A high-voltage wiring path may extend from the high-voltage electrical connectors through the rear compartment behind the main shroud and the lateral compartment behind the modular shroud to a high-voltage cable opening in the housing. Furthermore a low-voltage wiring path may extend from the low-voltage electrical connectors through the front compartment in front of the main shroud and the adjacent compartment outside of the lateral compartment to a low-voltage cable opening. Thus, the main shroud, the modular shroud, and the partition may isolate the high-voltage wiring path from the low-voltage wiring path.

Also by way of summary, disclosed herein are enclosures having trays to support circuitry and/or one or more electronic components. For example, an electronic component may be mounted on a printed circuit board that is connected to a tray. Similarly, one or more antennas may be connected to respective antenna mounts of the tray. In an embodiment, a tray is disposed within the circuitry bay of the enclosure. A first electronic component may be mounted on the tray. For example, the electronic component may be mounted on a printed circuit board that is mounted on a front face of the tray within the circuitry bay. Furthermore, a second electronic component, e.g., a second electronic component mounted on a second printed circuit board, may be positioned behind the tray and the first printed circuit board. For example, the tray may allow the first electronic component and/or printed circuit board to be stacked in front of the second electronic component and/or printed circuit board within the circuitry bay. Thus, the tray may separate an electronic component mounted on one side of the tray from another electrical or electronic component, e.g., a power supply, mounted on an opposite side of the tray. In an embodiment, the tray is disposed between the high-voltage electrical connectors and the low-voltage electrical connectors, which are arranged along an upper boundary of the wiring bay, such that a barrier wall of the tray separates the circuitry bay from the wiring bay. The tray may include an antenna mount extending into the wiring bay, and an antenna may be mounted on the antenna mount, e.g., between the antenna mount and an inner surface of the housing. For example, an antenna may be mounted on a respective antenna mount, within an antenna pocket of the antenna mount. In an embodiment, the tray includes several antenna mounts extending into the wiring bay, and a distance between the antenna mounts allows the main shroud to be positioned laterally between the antenna mounts. Thus, the tray may separate an antenna mounted on one side of the tray from a printed circuit board or another electrical or electronic component, e.g., a power supply, mounted on an opposite side of the tray.

Referring to FIG. 1, a perspective view of an enclosure containing components to monitor power output of photovoltaic arrays is illustrated in accordance with an embodiment of the present disclosure. An enclosure 100 may surround components used to monitor power generation. For example, the enclosure 100 may be a power management product for monitoring power output of a photovoltaic system having, e.g., twenty or more, photovoltaic arrays. The application of enclosure 100, however, is not to be so limited, and enclosure 100 may find utility in any application having internal circuitry and wiring. More particularly, enclosure 100 may have specific utility in applications involving electrical components, e.g., wires, which must be separated for regulatory or safety reasons. For example, enclosure 100 may be useful in applications requiring separation between high-voltage electrical components and low-voltage electrical components. In the following description, high-voltage may refer to electricity communicated between enclosure 100 and a power production unit, e.g., a photovoltaic array, or a power storage unit, e.g., a power grid. By contrast, low-voltage may refer to electricity associated with data communication either internal or external to enclosure 100. By way of example, high-voltage electricity may be in a range more than 100 V, e.g., 300 V, and low-voltage electricity may be in a range less than 24 V, e.g., 1-5 V.

In an embodiment, enclosure 100 includes a housing 102 having several walls surrounding an internal space. For example, housing 102 may include a top wall 104, a bottom wall 106, a front wall 108, and a lateral wall 110, as shown. Furthermore, housing 102 may include a rear wall opposite from front wall 108, and another lateral wall opposite from lateral wall 110, which are not shown. Housing 102 may be fabricated in any of a variety of shapes defined by the exterior walls that bound an internal volume. For example, housing 102 may have a convex polyhedron shape, e.g., a cuboid shape.

The internal space of housing 102 may be open or openable to a surrounding environment. For example, housing 102 may include one or more cable openings 112, such as conduit ports, that remain open and serve as egress points between the surrounding environment and the internal space of enclosure 100. One or more of the walls enclosing the internal space may be removable to open the inside of enclosure 100 to the surrounding environment. For example, front wall 108 of housing 102 may be divided into an upper portion (upper being in the direction of top wall 104) and an access panel 114 extending over a lower portion of the front of housing 102. Access panel 114 may be removable to allow an installer to access the internal space within housing 102.

Figure 2:
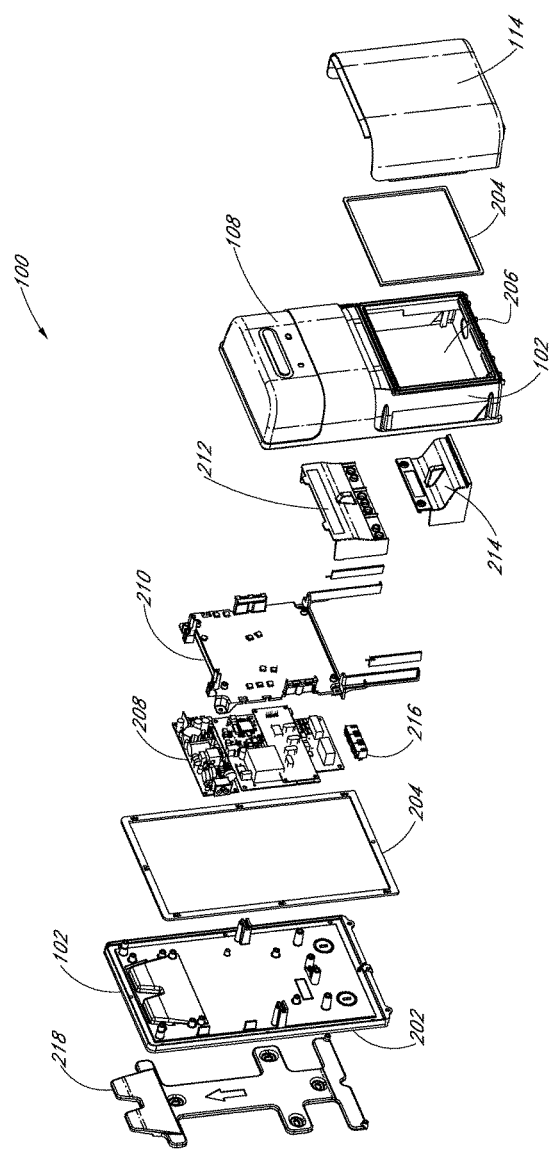
FIG. 2 illustrates an exploded view of an enclosure containing components to monitor power output of photovoltaic arrays, in accordance with an embodiment of the present disclosure.

Referring to FIG. 2, an exploded view of an enclosure containing components to monitor power output of photovoltaic arrays is illustrated in accordance with an embodiment of the present disclosure. In addition to having removable panels, such as access panel 114, housing 102 may include multiple parts that are assembled to form the enclosure walls. For example, housing 102 may include a front portion having, e.g., front wall 108, and a base 202 having the rear wall of housing 102 opposite of front wall 108. The multiple components of housing 102 may be formed using known fabrication techniques, including injection molding, metal stamping, blow molding, etc. Furthermore, the individual components may be assembled to each other using known manufacturing techniques, including welding, mechanical fastening, adhesive bonding, etc. In an embodiment, the assembled enclosure 100 must be watertight for use in outdoor environments such as ship docks, dairies, or breweries, and thus, one or more gaskets 204 may be placed between housing 102 components to inhibit the entry of solid contaminants and water alike. For example, a gasket 204 may be placed around a frontward edge surrounding a front opening 206 through which an installer can access the internal volume of enclosure 100. More particularly, the gasket 204 may seal against access panel 114, when access panel 114 is replaced over front opening 206, such that water and contaminants do not enter front opening 206.

Several components may be housed within enclosure 100. For example, one or more printed circuit boards 208 (PCBs) may be located in the internal space of enclosure 100 to perform functions such as receiving power from photovoltaic arrays, or processing and communicating data with external devices. Housing 102 may also enclose mounting components, such as a tray 210 to support PCBs or communications antennas. Furthermore, housing 102 may hold several barrier components, such as a main shroud 212, a modular shroud 214, and a partition 216. In an embodiment, the barrier components allow an installer to reconfigure wiring compartments and customize wiring paths within enclosure 100. The various internal components housed within enclosure 100 are described more fully below.

The assembled enclosure 100 may be deployed at various sites to monitor photovoltaic system output. For example enclosure 100 may include a mounting bracket 218, which attaches to base 202 of housing 102. Mounting bracket 218 may be mounted on an exterior wall of a home, office, barn, etc. Thus, enclosure 100 may be oriented with top wall 104 facing upward, front wall 108 in front of the rear wall, and lateral walls 110 on a right side or a left side of housing 102.

Figure 3:
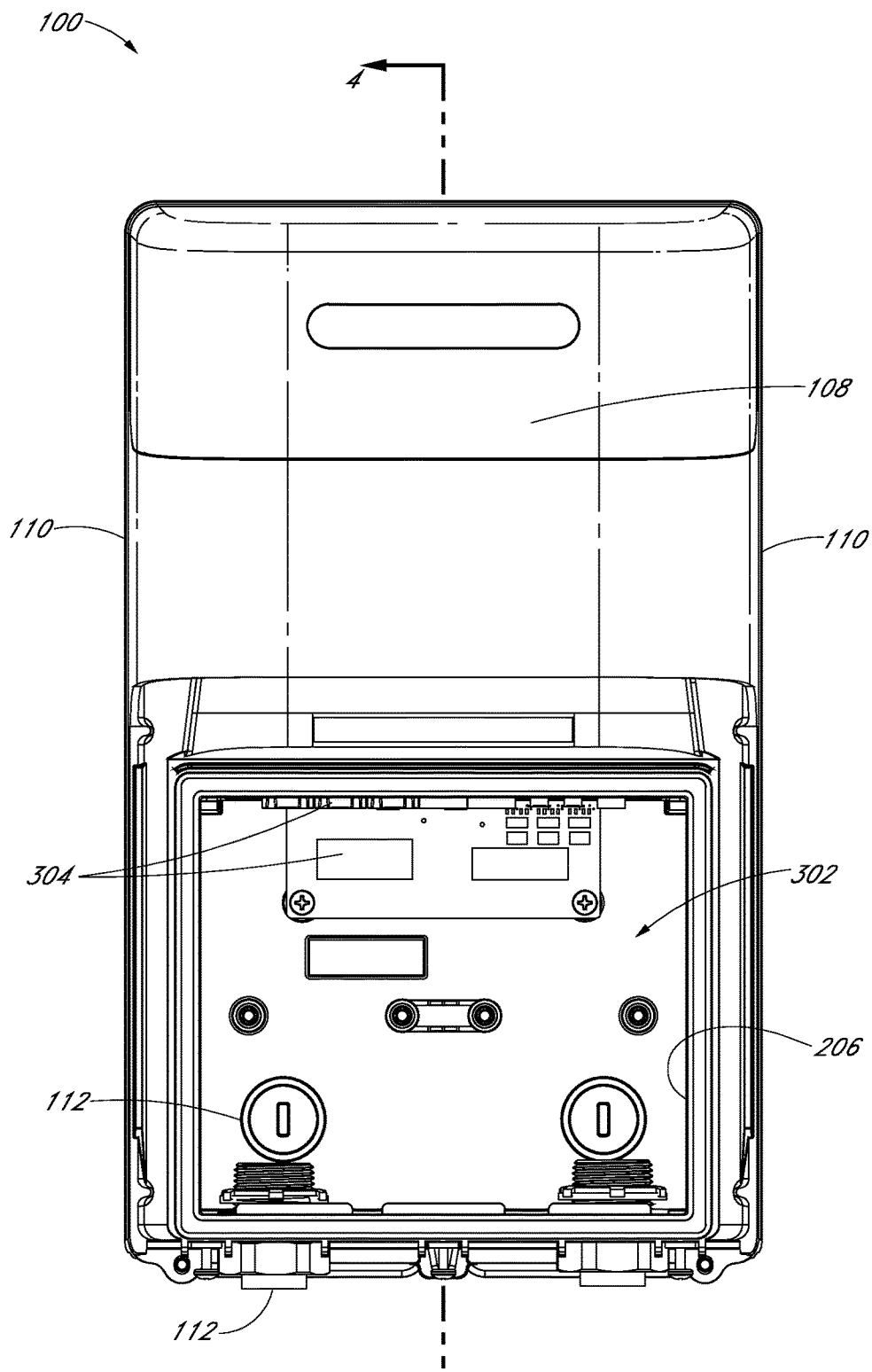
FIG. 3 illustrates a front view of an enclosure having a wiring bay accessible through a front opening, in accordance with an embodiment of the present disclosure.

Referring to FIG. 3, a front view of an enclosure having a wiring bay accessible through a front opening is illustrated in accordance with an embodiment of the present disclosure. In an embodiment, enclosure 100 includes several bays, or principal compartments, that may be designated based on whether they are easily accessible by an installer. For example, enclosure 100 may include a circuitry bay that contains one or more PCBs 208 and is covered by front wall 108 of the assembled enclosure 100. The portion of housing 102 having front wall 108 may be attached to base 202, and thus, access to the circuitry bay behind front wall 108 may require an installer to detach front wall 108 from base 202. By contrast, enclosure 100 may include a wiring bay 302 that contains high-voltage and low-voltage wiring, which is ordinarily covered by access panel 114. An installer, however, may easily (by removing several screws) access wiring bay 302 by removing access panel 114 from the portion of housing 102 having front wall 108, and thus, the installer may install or manipulate the wiring through front opening 206. More particularly, the installer may route high-voltage and/or low-voltage wiring through cable openings 112 in housing 102 and across wiring bay 302 to electrical connectors 304 that provide electrical connections to electronics and circuitry stored within the circuitry bay.

The cable openings 112 through which wiring enters and exits enclosure 100, as well as electrical connectors 304, may be located anywhere that an installer may access them through front opening 206. For example, cable openings 112 may be placed in bottom wall 106 or in the rear wall of housing 102, as shown. Alternatively, cable openings 112 can be located in one or more of lateral walls 110, i.e., on a right side or left side of housing 102. Similarly, electrical connectors 304 may be positioned in an upper region of wiring bay 302, but below an upper edge of front opening 206, or alternatively, electrical connectors 304 may be arranged behind the upper edge of front opening 206 between wiring bay 302 and the circuitry bay. In an embodiment, the electrical connectors 304 or the cable openings 112 may be customizable. For example, one or more cable openings 112 may be fabricated as knockouts, such as cable openings 112 shown in the rear wall. Knockouts allow an installer to first decide upon a location in the housing 102 to route wires through, and then to create an opening at that location by removing a plug to expose an egress port for wiring. Accordingly, the installer has discretion over wire routing paths, allowing the installer to route high-voltage and low-voltage wiring into enclosure 100 in such a way that the cabling conduits outside of enclosure 100 need not be overlapped. This can provide a more clean and appealing aesthetic. Such flexibility also allows cable routing to be adapted to the surrounding environment. For example, when enclosure 100 is mounted directly above another device, such as a power meter, enclosure 100 would allow the installer to route cabling through lateral wall 110 rather than through bottom wall 106.

Figure 4:
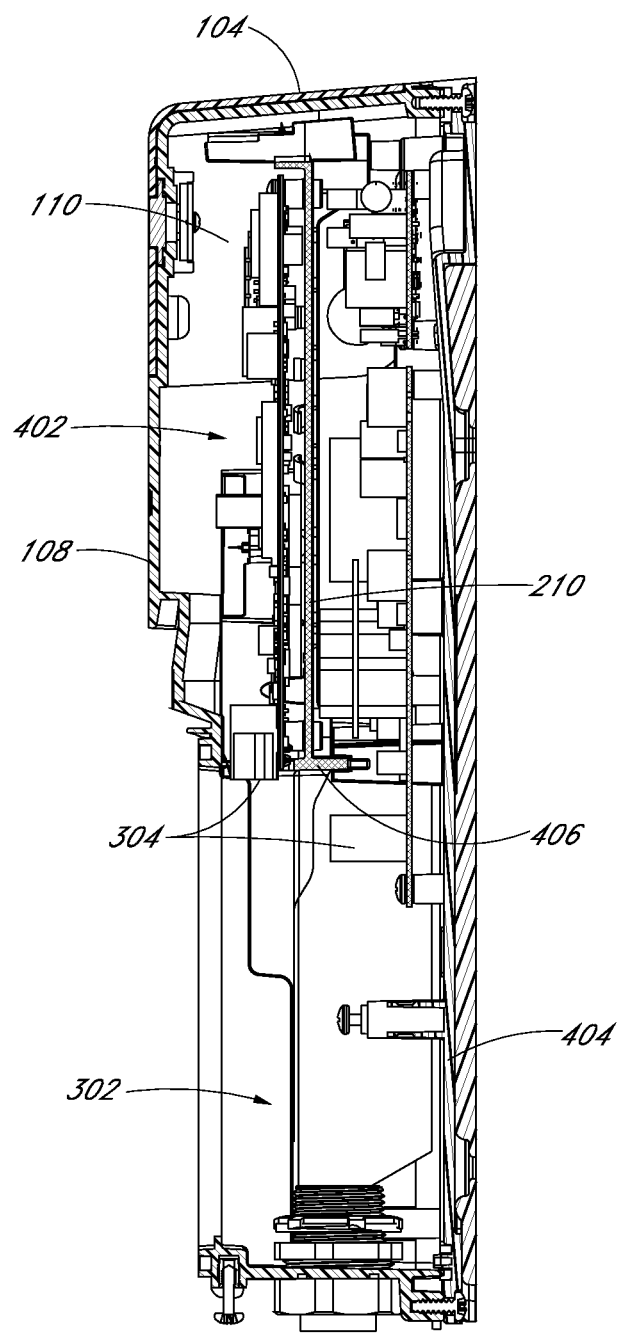
FIG. 4 illustrates a cross-sectional view, taken about line A-A of FIG. 3, of an enclosure having a housing around a circuitry bay and a wiring bay, in accordance with an embodiment of the present disclosure.

Referring to FIG. 4, a cross-sectional view, taken about line A-A of FIG. 3, of an enclosure having a housing around a circuitry bay and a wiring bay is illustrated in accordance with an embodiment of the present disclosure. In an embodiment, a circuitry bay 402 may be defined between front wall 108, top wall 104, lateral walls 110, and a rear wall 404 of housing 102. Furthermore, circuitry bay 402 may be separated from wiring bay 302 by a spatial boundary defined by electrical connectors 304 and/or tray 210. More particularly, a plane passing through electrical connectors 304 and a barrier wall 406 of tray 210 may define a bottom boundary of circuitry bay 402 (or a top boundary of wiring bay 302). Although the boundary may not be solid, any gaps between electrical connectors 304, barrier wall 406, and other components arranged along the boundary may be small enough to inhibit the insertion of fingers into circuitry bay 402 from wiring bay 302. By way of example, the gaps along the bottom boundary may be less than 0.5 inch, e.g., less than 0.25 inch. Thus, circuitry bay 402 may be physically isolated from wiring bay 302.

Figure 5:
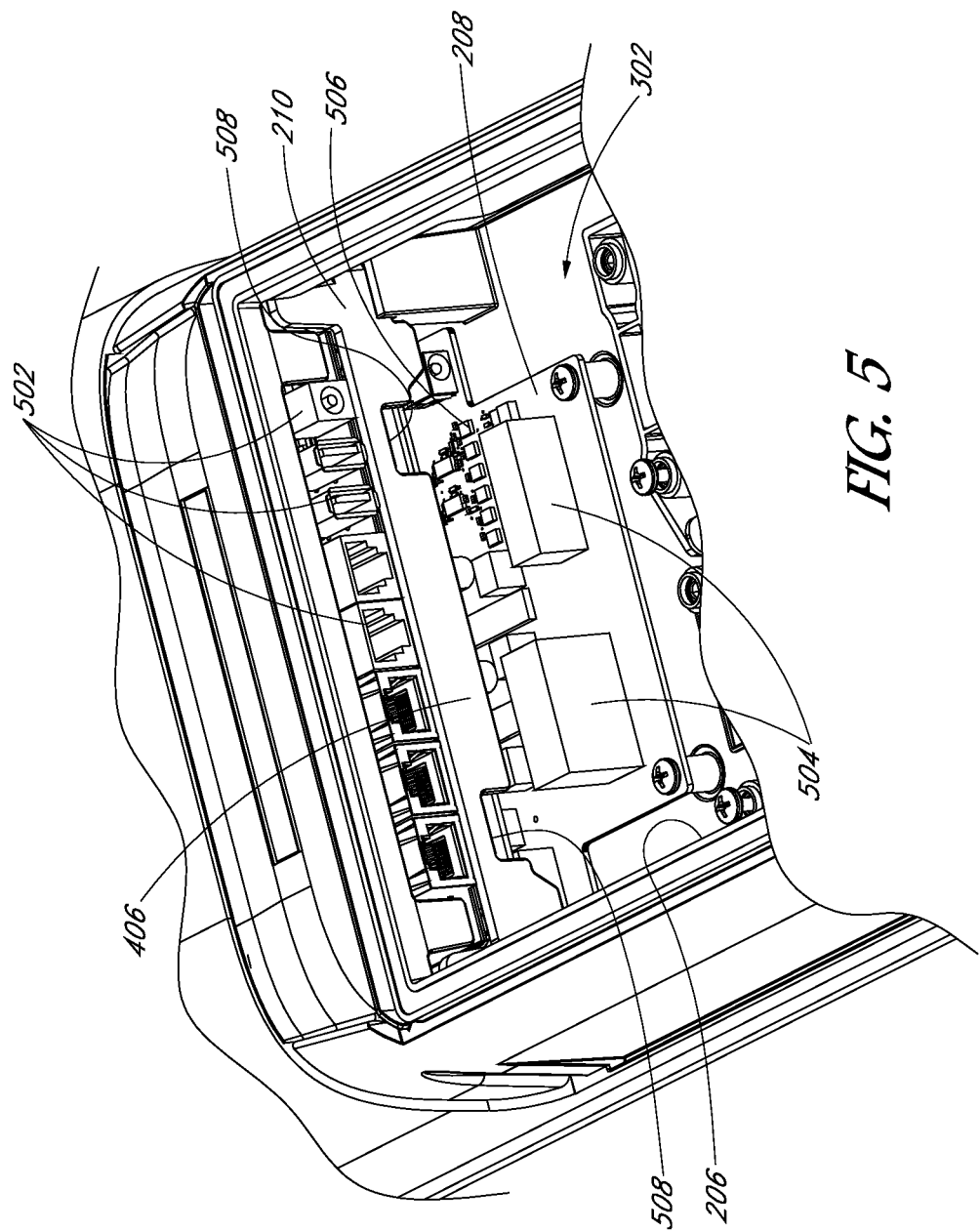
FIG. 5 illustrates a partial perspective view of an enclosure having electrical connectors between a circuitry bay and a wiring bay, in accordance with an embodiment of the present disclosure.

Referring to FIG. 5, a partial perspective view of an enclosure having electrical connectors between a circuitry bay and a wiring bay is illustrated in accordance with an embodiment of the present disclosure. In an embodiment, an upper region of wiring bay 302 may be accessible through front opening 206. As shown, electrical connectors 304 may include one or more low-voltage electrical connectors 502 arranged between wiring bay 302 and circuitry bay 402. Furthermore, electrical connectors 304 may include one or more high-voltage electrical connectors 504 arranged between wiring bay 302 and circuitry bay 402. Although high-voltage electrical connectors 504 are not shown as being directly aligned with a plane passing through low-voltage electrical connectors 502 and barrier wall 406, high-voltage electrical connectors 504 may nonetheless be considered to be between wiring bay 302 and circuitry bay 402 since an installer may be unable to reach past high-voltage electrical connectors 504 into circuitry bay 402. Furthermore, PCB 208 supporting high-voltage electrical connectors 504 and/or electronic components 506 on the PCB 208 may inhibit entry into circuitry bay 402, and thus, may help define the boundary between bays.

Low-voltage electrical connectors 502 and high-voltage electrical connectors 504 may be mounted on, or otherwise coupled with, PCBs located at least partially within circuitry bay 402. For example, high-voltage electrical connectors 504 may include terminal blocks for connecting individual high-voltage electrical wires to a power manager PCB 208. The power manager PCB 208 may mechanically support and electrically connect various electronic components 506, such as integrated circuits, transistors, capacitors, etc., through traces, vias, etc. Similarly, low-voltage electrical connectors 502 may include data communication connectors such as plug and socket connectors, e.g., RJ45, universal serial bus (USB) connectors, and other communication port types for connecting low-voltage wiring or cabling to a monitoring system PCB. The monitoring system PCB may mechanically support and electrically connect various electronic components, such as integrated circuits, transistors, capacitors, etc., through traces, vias, etc. The electrical connectors 304 may be mounted directly on a respective PCBs, such as by soldering the electrical connectors 304 to respective PCB 208. Alternatively, the electrical connectors 304 may be indirectly coupled with the respective PCB 208. For example, low-voltage electrical connectors 502 may be mounted on a bottom edge of tray 210 and have terminals that are connected to corresponding terminals on the monitoring system PCB 208 by electrical wires.

In an embodiment, low-voltage electrical connectors 502 are located on a first side of the tray 210. For example, the low-voltage electrical connectors 502 may be located on a side of tray 210 nearest to a front wall 108. Thus, low-voltage electrical connectors 502 may be considered to be located in front of tray 210. For example, low-voltage electrical connectors 502 may be mounted on a front edge of barrier wall 406, or on the monitoring system PCB in front of tray 210. Furthermore, high-voltage electrical connectors 504 may be located on a second side of tray 210. For example, the high-voltage electrical connectors 504 may be located on an opposite side of tray 210 from the first side. Thus, the high-voltage electrical connectors 504 may be farther from front wall 108 than low-voltage electrical connectors 502. Accordingly, high-voltage electrical connectors 504 may be considered to be located behind tray 210. For example, high-voltage electrical connectors 504 may be mounted on the power manager PCB 208, which may be mounted on a rear surface of wiring bay 302 and/or circuitry bay 402. Accordingly, low-voltage electrical connectors 502 may be in front of high-voltage electrical connectors 504. More particularly, low-voltage electrical connectors 502 may be nearer to front opening 206 than high-voltage electrical connectors 504. Thus, an installer may route high-voltage electrical wires through wiring bay 302 behind low-voltage electrical wires. It will be appreciated, as noted above, that the terms "in front of" and "behind" are relative terms used to indicate relative positions and that components may be located on different sides of tray 210 that are not the front and back sides. For example, high-voltage electrical connectors 504 may be located on a top side of tray 210 nearer to top wall 104 and low-voltage electrical connectors 502 may be located on an opposite side of tray 210, e.g., a bottom side of tray 210, farther from top wall 104. In such case, tray 210 may nonetheless separate a first electronic component on one side from a second electronic component on an opposite side.

Enclosure 100 may include various reference features to facilitate secure and accurate placement of barrier components that divide wiring bay 302 into separate compartments. For example, tray 210 may include one or more notches 508 to mate with corresponding tabs on a shroud. Notches 508 may be formed in barrier wall 406 of tray 210, and since tray 210 may be located between low-voltage electrical connectors 502 and high-voltage electrical connectors 504, when the shroud engages notches 508, it may physically separate a wiring compartment in line with low-voltage electrical connectors 502 from a wiring compartment in line with high-voltage electrical connectors 504.

Figure 6:
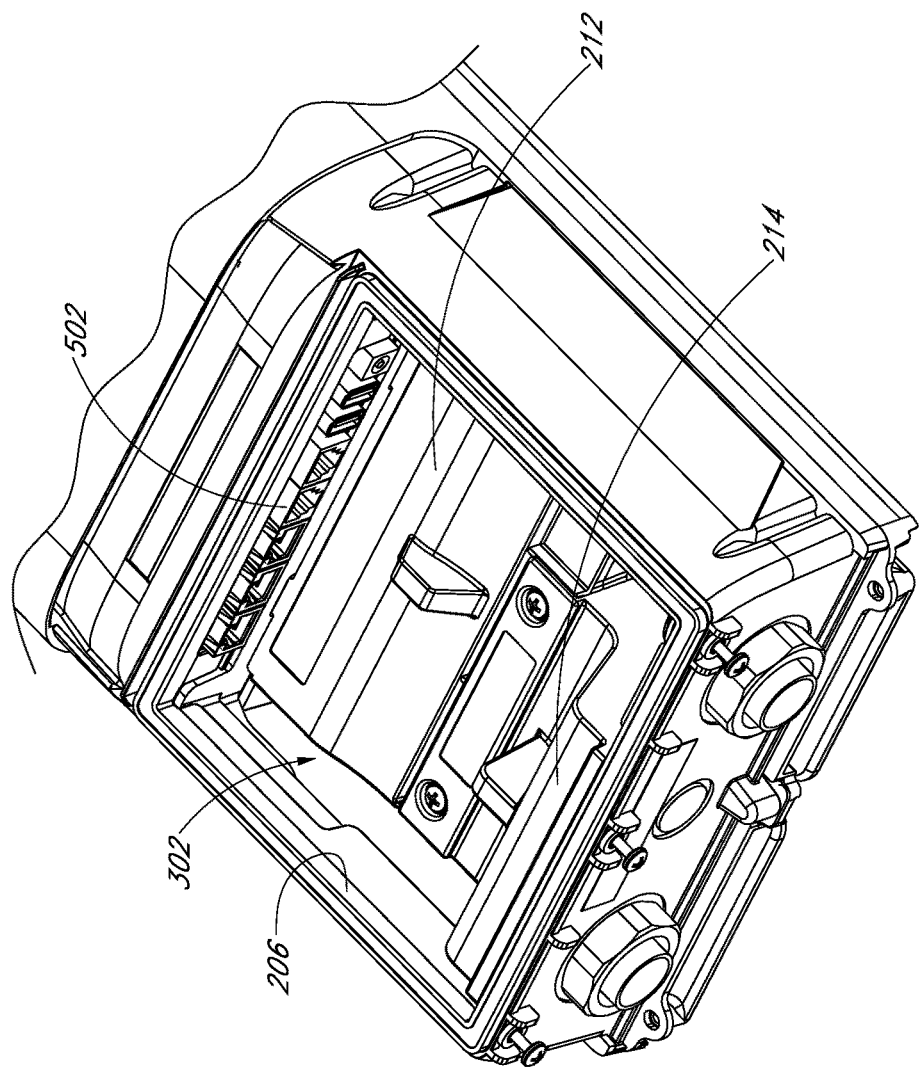
FIG. 6 illustrates a partial perspective view of an enclosure having reconfigurable compartments, in accordance with an embodiment of the present disclosure.

Referring to FIG. 6, a partial perspective view of an enclosure having reconfigurable compartments is illustrated in accordance with an embodiment of the present disclosure. Front opening 206 of enclosure 100 may be sized to allow barrier components to be inserted and removed from wiring bay 302. For example, main shroud 212 may be placed in an upper portion of wiring bay 302 and have a front surface behind low-voltage electrical connectors 502. By contrast, the front surface of main shroud 212 may be located in front of high-voltage electrical connectors 504, which are hidden behind main shroud 212. Thus, main shroud 212 may create a front compartment of wiring bay 302 between the front surface and front opening 206 (or access panel 114 covering front opening 206). Low-voltage electrical connectors 502 may be arranged along a side of the front compartment such that low-voltage wiring and/or cabling may be routed in front of main shroud 212 to connect to low-voltage electrical connectors 502. Similarly, main shroud 212 may create a rear compartment of wiring bay 302, separated from the front compartment by the front surface of main shroud 212, and the rear compartment may occupy a space between main shroud 212 and a back surface of wiring bay 302. Thus, high-voltage electrical connectors 504 may be arranged along a side of the rear compartment such that high-voltage wiring may be routed behind main shroud 212 to connect to high-voltage electrical connectors 504.

Modular shroud 214 may also be inserted and removed from wiring bay 302 through front opening 206. When modular shroud 214 is disposed in wiring bay 302, a front surface of modular shroud 214 may face the front compartment created by main shroud 212. More particularly, like main shroud 212, modular shroud 214 may also have a wall that separates a frontward portion of wiring bay 302 in front of modular shroud 214 from a rearward portion of wiring bay 302 behind modular shroud 214. In addition to having respective front surfaces between a frontward portion of wiring bay 302, e.g., a low-voltage zone, and a rearward portion of wiring bay 302, e.g., a high-voltage zone, main shroud 212 or modular shroud 214 may also include lateral surfaces extending between the front surface of the respective shroud and a rear surface of wiring bay 302. As described more fully below, modular shroud 214 may be mounted on main shroud 212 in several locations such that the rear spaces defined behind the shrouds, e.g., the spaces between the front surface of the shroud, lateral surfaces of the shroud, and the rear surface of wiring bay 302, are spatially interconnected to provide a high-voltage zone through which high-voltage wires connected to high-voltage electrical connectors 504 may be routed. Depending on the location at which modular shroud 214 is mounted on main shroud 212, e.g., toward a left side or a right side of main shroud 212, the high-voltage zone will change. Thus, the ability to move the modular shroud 214 relative to main shroud 212 and the ability to mount modular shroud 214 in different locations provides for reconfigurable compartments to accommodate different wiring strategies.

Figure 7:
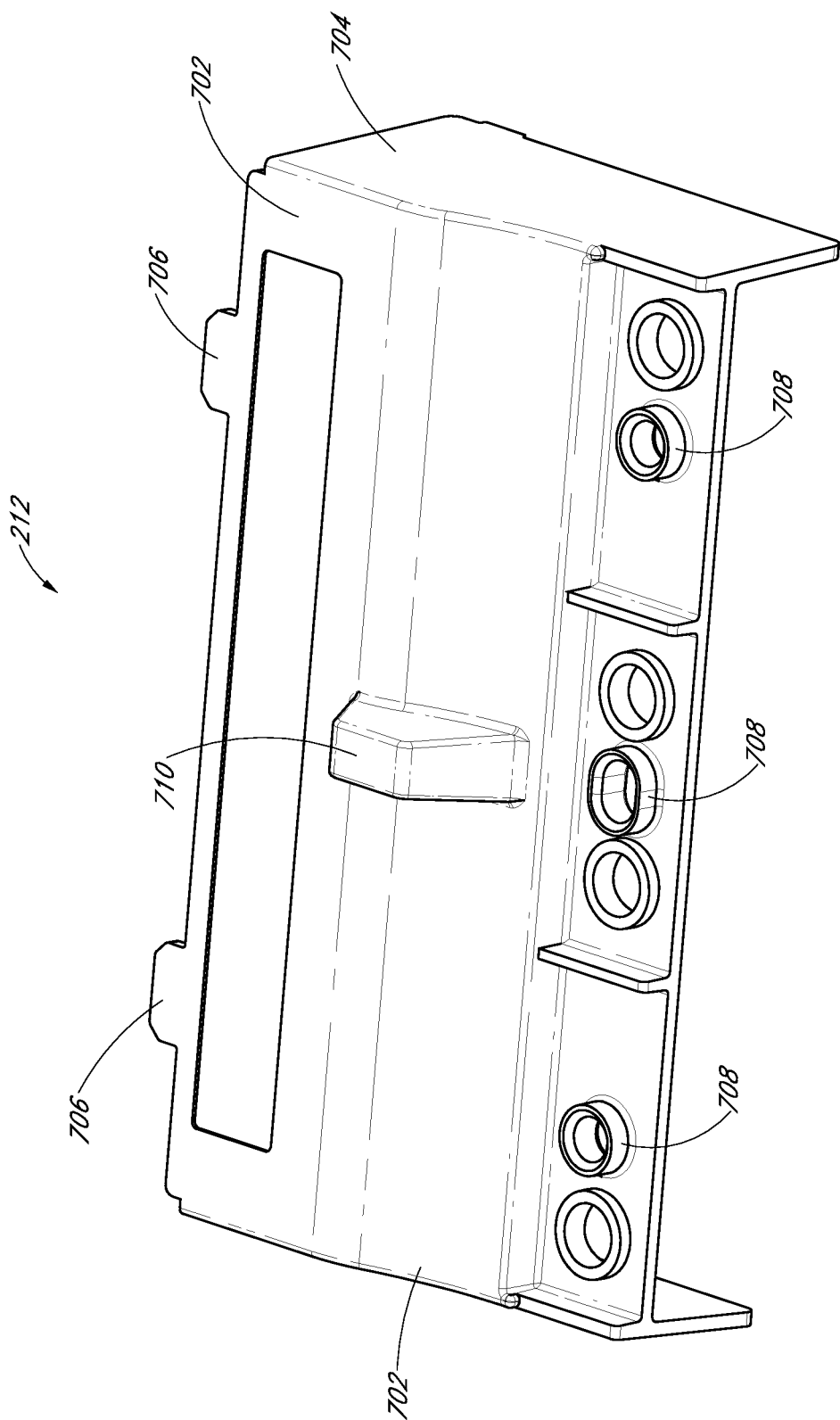
FIG. 7 illustrates a perspective view of a main shroud, in accordance with an embodiment of the present disclosure.

Referring to FIG. 7, a perspective view of a main shroud is illustrated in accordance with an embodiment of the present disclosure. Main shroud 212 may include structural features that separate one area of wiring bay 302 from another. For example, main shroud 212 may include main front wall 702 facing front opening 206 and/or one or more main lateral walls 704 facing side surfaces of wiring bay 302. As discussed above, the walls of main shroud 212 may define and enclose a portion of a high-voltage zone. For example, when main shroud 212 is placed in wiring bay 302 with a back edge of main lateral wall 704 adjacent to a rear surface of wiring bay 302, a rear compartment may be formed between main shroud 212 and the rear surface. Main shroud 212 may include other walls not shown in FIG. 7. For example, main shroud 212 may include a main rear wall extending between bottom edges of main lateral walls 704 and opposite of main front wall 702, to form an enclosed channel between the walls of main shroud 212 without requiring main lateral walls 704 to be abutted against the rear surface of wiring bay 302. Similarly, main shroud 212 may include one or more additional walls parallel to and between main lateral walls 704 that could further compartmentalize a rear compartment of wiring bay 302. For example, a medial wall extending backward from main front wall 702 could divide the rear compartment into a leftward rear compartment and a rightward rear compartment. These and other wall configurations may be used to create wiring compartments that isolate high-voltage wires connected to high-voltage electrical connectors 504 from low-voltage wires connected to low-voltage electrical connectors 502.

Main shroud 212 may include structural features to couple main shroud 212 with other enclosure components. For example, main shroud 212 may include one or more tabs 706 to register main shroud 212 with a component that separates wiring bay 302 from circuitry bay 402. In an embodiment, tabs 706 of main shroud 212 engages notches 508 formed in tray 210 to accurately position main shroud 212 relative to tray 210. The tabs 706 may accurately position main shroud 212 laterally within wiring bay 302 to ensure that the rear compartment behind main shroud 212 aligns with high-voltage electrical connectors 504. Furthermore, the engagement of tabs 706 with notches 508 may ensure that an upper edge of main front wall 702 abuts against tray 210 and such that wiring or fingers are unable to pass from the front compartment, between main shroud 212 and tray 210, into rear compartment.

In addition to accurately locating main shroud 212 with respect to wiring bay 302 and/or tray 210, main shroud 212 may include structural features to accurately position other barrier components relative to main shroud 212. For example, main shroud 212 may include one or more main shroud couplings 708 that engage with modular shroud 214, allowing modular shroud 214 to be mounted on main shroud 212 in predetermined locations. In an embodiment, main shroud couplings 708 include two or more tubular bosses that extend from main front wall 702 toward front opening 206. Each tubular boss may engage with a respective coupling feature of modular shroud 214, e.g., a circular bore formed in a rear surface of modular shroud 214, or a cylindrical boss extending from the rear surface of modular shroud 214, to register modular shroud 214 with main shroud 212.

Main shroud 212 may also include features to facilitate the insertion and removal of main shroud 212 in wiring bay 302. For example, main shroud 212 may include a handle 710 projecting from main front wall 702 toward front opening 206. Handle 710 may be a knob, hook, or other protrusion sized and shaped to be gripped by an installer. Thus, the installer may pinch handle 710 to insert main shroud 212 in wiring bay 302 and engage tabs 706 with notches 508.

Figure 8:
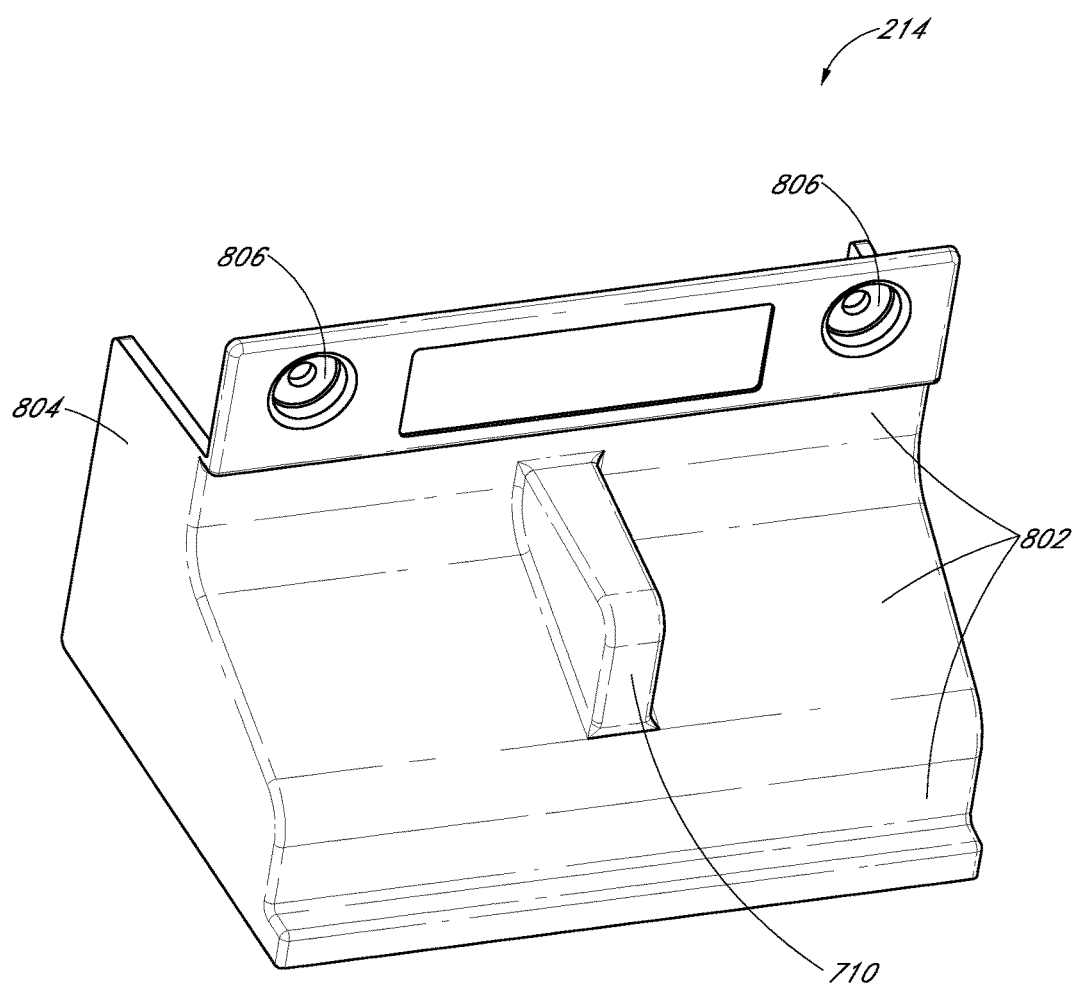
FIG. 8 illustrates a perspective view of a modular shroud, in accordance with an embodiment of the present disclosure.

Referring to FIG. 8, a perspective view of a modular shroud is illustrated in accordance with an embodiment of the present disclosure. Modular shroud 214 may include structural features that separate one area of wiring bay 302 from another. For example, modular shroud 214 may include modular front wall 802 facing front opening 206 and/or one or more modular lateral walls 804 facing side surfaces of wiring bay 302. As discussed above, the walls of modular shroud 214 may define and enclose a portion of a high-voltage zone. For example, when modular shroud 214 is mounted on main shroud 212 in a leftward or rightward location, modular lateral walls 804 may extend toward a rear surface of wiring bay 302 such that a back edge of modular lateral walls 804 is adjacent to, or abutted against, the rear surface and a compartment may be formed between modular shroud 214 and the rear surface. This compartment may be referred to as a lateral compartment since the compartment can be adjusted laterally left or right by positioning modular shroud 214 at different locations relative to main shroud 212. The lateral compartment may be accessible from the rear compartment behind main shroud 212 to allow high-voltage electrical wires connected to high-voltage electrical connectors 504 to be routed through the rear compartment and the lateral compartment.

Modular shroud 214 may include other walls not shown in FIG. 8. For example, modular shroud 214 may include a modular rear wall extending between bottom edges of modular lateral walls 804, opposite of modular front wall 802, to form an enclosed channel between the walls of modular shroud 214 without requiring modular lateral walls 804 to be abutted against the rear surface of wiring bay 302. Similarly, modular shroud 214 may include one or more additional walls parallel to and between modular lateral walls 804 that could further compartmentalize a lateral compartment behind modular shroud 214. For example, a medial wall extending backward from modular front wall 802 could divide the lateral compartment into a leftward lateral compartment and a rightward lateral compartment. These and other wall configurations may be used to create wiring compartments that isolate high-voltage wires connected to high-voltage electrical connectors 504 from low-voltage wires connected to low-voltage electrical connectors 502. Wiring compartments may also isolate some high-voltage wires, e.g., wires connected to a photovoltaic array, from other high-voltage wires, e.g., wires connected to a power grid.

Modular shroud 214 may include structural features to couple modular shroud 214 with main shroud 212. For example, modular shroud 214 may include one or more modular shroud couplings 806 that engage with main shroud couplings 708, allowing modular shroud 214 to be mounted on main shroud 212 in predetermined locations. In an embodiment, modular shroud couplings 806 include two or more cylindrical bosses that extend from modular front wall 802 away front opening 206. Each cylindrical boss may engage with a respective main shroud coupling 708, e.g., fitting within an inner diameter of a tubular boss extending forward from main front wall 108, to register modular shroud 214 with main shroud 212. Tubular bosses and cylindrical bosses are discussed by way of example, and main shroud couplings 708 and modular shroud couplings 806 may be formed in any manner that allows the couplings to engage with each other and to accurately locate one shroud relative to another. Furthermore, the couplings may provide a removable attachment between the shrouds, meaning that the couplings may engage to register the shrouds relative to each other and provide some minimal retention force, such as a light press fit, but an installer may disengage the modular shroud 214 to move the shroud to a different location relative to main shroud 212. A more permanent attachment between the shrouds may be provided by mechanical fasteners, such as screws, which may be placed after main shroud couplings 708 and modular shroud couplings 806 are connected to each other.

Modular shroud 214 may also include features to ease the insertion and removal of modular shroud 214 in wiring bay 302. For example, modular shroud 214 may include a handle 710 projecting from modular front wall 802 toward front opening 206. Handle 710 may be a knob, hook, or other protrusion sized and shaped to be gripped by an installer. Thus, the installer may pinch the handle 710 to insert and position modular shroud 214 in the wiring bay 302 at different locations relative to main shroud 212.

Figure 9:
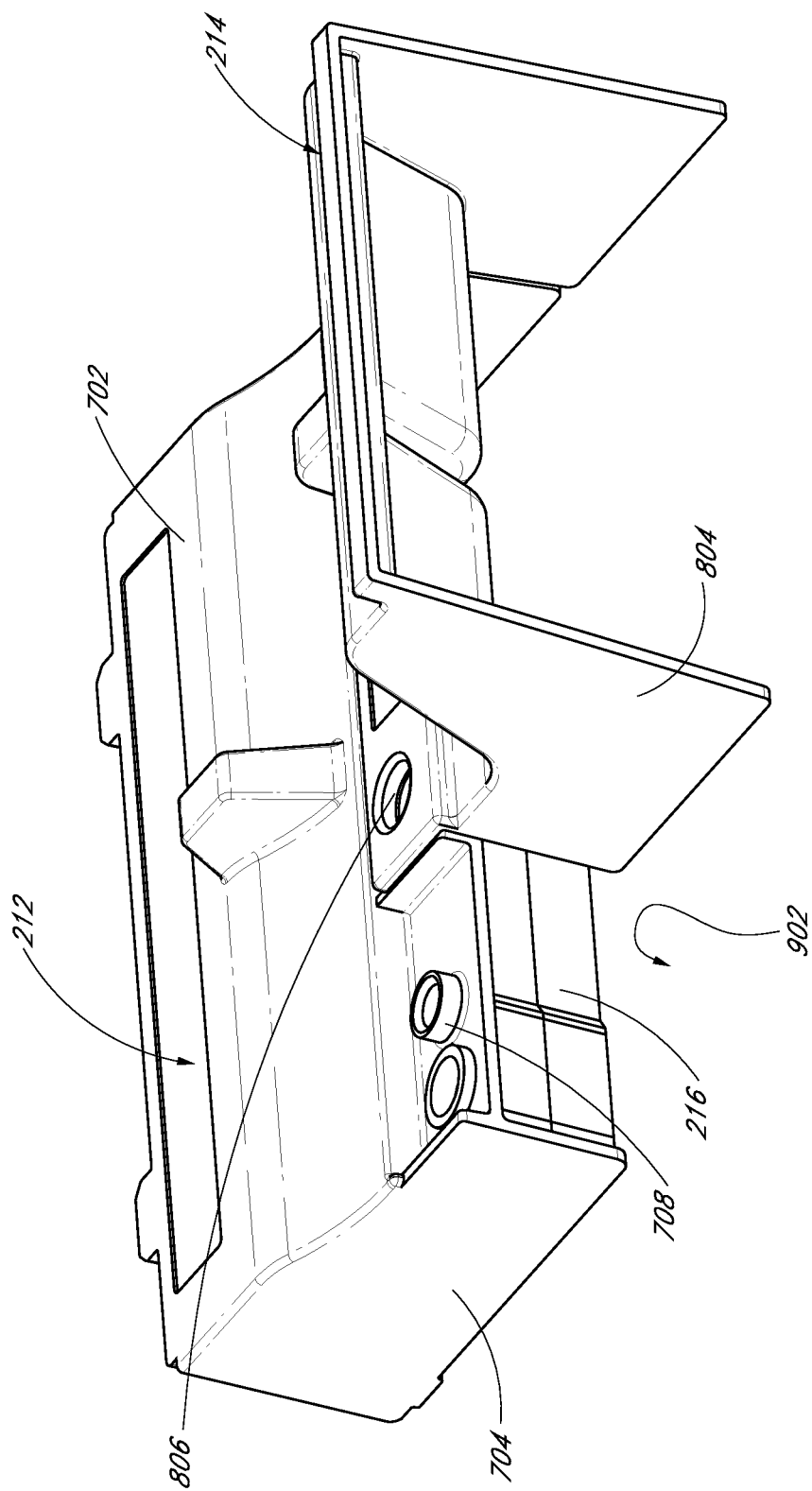
FIG. 9 illustrates a perspective view of a modular shroud mounted on a main shroud, in accordance with an embodiment of the present disclosure.

Referring to FIG. 9, a perspective view of a modular shroud mounted on a main shroud is illustrated in accordance with an embodiment of the present disclosure. Modular shroud 214 may be mounted on main shroud 212 at several locations. In an embodiment, three main shroud couplings 708 are evenly spaced along a lower portion of main front wall 702. Modular shroud 214 may include a pair of couplings to engage with two of the main shroud couplings 708 at a time, e.g., the left and middle main shroud coupling 708 or the right and middle main shroud coupling 708. Thus, the modular shroud 214 may be picked and placed between a left side or a right side of main shroud 212. That is, as shown in FIG. 9, when the modular shroud couplings 806 engage the right and middle main shroud couplings 708, the modular shroud 214 is registered toward a right side of main shroud 212. Moving the modular shroud 214 such that the modular shroud couplings 806 engage the left and middle main shroud couplings 708 registers the modular shroud 214 toward a left side of main shroud 212.

In an embodiment, modular lateral walls 804 are separated by a distance less than a distance separating main lateral walls 704. Thus, the lateral compartment behind modular shroud 214 may be narrower than the rear compartment behind main shroud 212. As such, an additional wiring bay compartment may be defined between modular lateral wall 804 and a side surface of wiring bay 302. This additional compartment may be referred to as an adjacent compartment 902 because it is adjacent to the lateral compartment, being separated from the lateral compartment by modular lateral wall 804. In an embodiment, adjacent compartment 902 is accessible from the front compartment in front of main shroud 212 to allow low-voltage electrical wires connected to low-voltage electrical connectors 502 to be routed through the front compartment and adjacent compartment 902. It can thus be seen that the lateral compartment behind modular shroud 214 is accessible from the rear compartment behind main shroud 212, and adjacent compartment 902 opposite of modular lateral wall 804 from lateral compartment, is accessible from the front compartment in front of main shroud 212.

Although adjacent compartment 902 is accessible from the front compartment, it may also be accessible from the rear compartment. Thus, an additional barrier component may be employed to block access to the adjacent compartment 902 from the rear compartment. In an embodiment, partition 216 is located between main lateral wall 704 and modular lateral wall 804 to create a barrier between adjacent compartment 902 and the rear compartment behind main shroud 212. Partition 216 may be a separate component that is placed within wiring bay 302 at a predetermined location relative to main shroud 212 and modular shroud 214. Several examples of this are described below.

In an embodiment, partition 216 is integrally formed with one of the shrouds, or is attached directly to one of the shrouds. For example, partition 216 may be a cantilevered wall integrally molded perpendicular to modular lateral wall 804 such that it extends laterally to block the passage between the rear compartment and the adjacent compartment 902. It will be appreciated that the modular shroud 214 could therefore be formed such that when it is moved to a different location, the shroud may be flipped to face modular front wall 802 toward a rear surface of wiring bay 302, causing the cantilever wall to extend rightward instead of leftward. Accordingly, the wiring compartments of wiring bay 302 may be reconfigured with only two barrier components, e.g., main shroud 212 and modular shroud 214, and not require the addition of a separate partition 216 component to separate a rear compartment and adjacent compartment 902.

Figure 10:
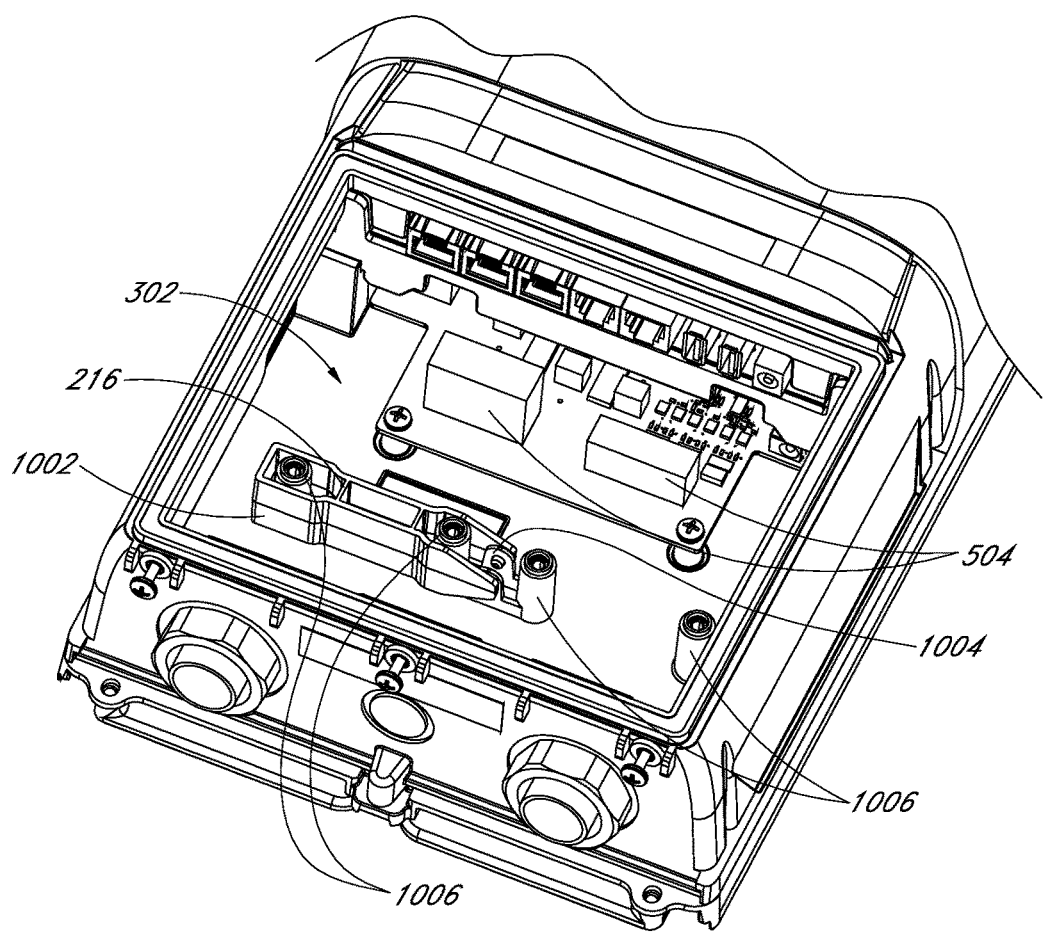
FIG. 10 illustrates a partial perspective view of an enclosure having a hinged partition, in accordance with an embodiment of the present disclosure.

Referring to FIG. 10, a partial perspective view of an enclosure having a hinged partition is illustrated in accordance with an embodiment of the present disclosure. In an embodiment, partition 216 moves (or is configured to move) between a first location and a second location within wiring bay 302. For example, partition 216 may include a frame or other structure having a partition wall 1002 facing a direction orthogonal to the rear compartment or adjacent compartment 902. More particularly, partition wall 1002 may separate the rear compartment from adjacent compartment 902 when main shroud 212 is placed within wiring bay 302. Partition 216 may be coupled with a surface of wiring bay 302 by a hinge 1004. For example, partition 216 may be hinged to base 202 of housing 102 by hinge 1004 extending forward from a back surface of wiring bay 302. Accordingly, partition 216 may be swung about a first end at hinge 1004 such that a second end of partition 216 may be moved from facing a left surface of wiring bay 302 to facing a right surface of wiring bay 302. When the partition 216 is in the leftward location it may separate the rear compartment behind main shroud 212 from an adjacent compartment 902 on the left side of wiring bay 302 and when the partition 216 is in the rightward location it may separate the rear compartment from an adjacent compartment 902 on the right side of wiring bay 302. In this way, partition 216 may be relocated to form the barrier that separates the high-voltage zone from the low-voltage zone, regardless of whether modular shroud 214 is mounted on main shroud 212 in a leftward or rightward position.

In addition to having movable structures like partition 216 that block the routing of wiring, enclosure 100 may include structural features that direct and maintain the wiring routing along a predetermined path. For example, several routing posts 1006 may extend from a rear surface of wiring bay 302 at predetermined locations such that the wiring path passes between pairs of posts. As shown, there may be a pair of routing posts 1006 located on a left side of wiring bay 302 (currently passing through post holes formed in partition 216) and a pair of routing posts 1006 located on a right side of wiring bay 302. High-voltage wiring connected to high-voltage electrical connectors 504 may be routed downward through the right pair of posts, and thus, may be directed through a rightward cable opening 112 in bottom wall 106 of housing 102. By contrast, if partition 216 is swung to the rightward side of wiring bay 302, the high-voltage wiring may be routed through the leftward pair of posts into a leftward cable opening 112.

Figure 11:
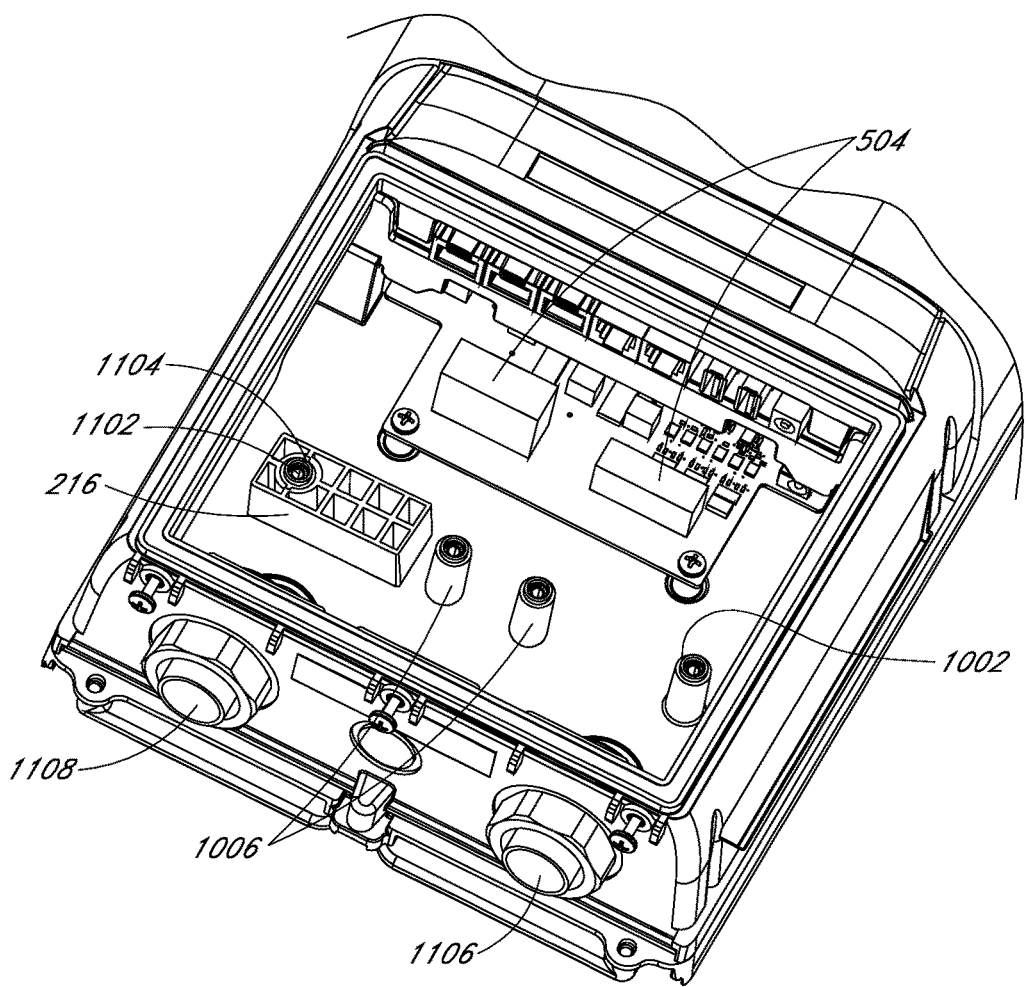
FIG. 11 illustrates a partial perspective view of an enclosure having a pick-and-place partition, in accordance with an embodiment of the present disclosure.

Referring to FIG. 11, a partial perspective view of an enclosure having a pick-and-place partition is illustrated in accordance with an embodiment of the present disclosure. The hinged partition 216 described above represents only one type of movable partition 216. Partition 216 may also move from a first location to a second location by sliding, rotating, being picked and placed, etc. In an embodiment, partition 216 is a pick-and-place part, having registration holes or slots to engage with one or more protrusions or posts in wiring bay 302. For example, a keyed routing post 1102 may extend from a rear surface of wiring bay 302 and may include one or more key features. The key features may engage corresponding keyways 1104 in partition 216, e.g., the keyways 1104 may be formed in a hole passing through partition 216. Thus, by sliding keyed routing post 1102 into the hole having keyway 1104, partition 216 may be stabilized against rotation and fixed within wiring bay 302. As shown, a second keyed routing post 1102 may be located elsewhere within wiring bay 302, and thus, partition 216 may be picked off of the first keyed routing post 1102 and placed onto the second keyed routing post 1102 to block wire routing through a different area of wiring bay 302. For example, high-voltage wiring may be routed from high-voltage electrical connectors 504 on a power manager PCB, through a pair of routing posts 1006 not blocked by partition 216, and through cable opening 112 into a surrounding environment. Since cable opening 112 serves as a passage for high-voltage wiring it may be referred to as a high-voltage cable opening 1106. Similarly, a cable opening 112 that receives low-voltage wiring from the adjacent compartment 902 below partition 216 serves as a passage for low-voltage wiring and it may thus be referred to as a low-voltage cable opening 1108.

It will be appreciated that partition 216 is movable not only by being relocated to an entirely different region of wiring bay 302, but it may also be moved such that it continues to occupy at least a same region of space within wiring bay 302. For example, partition 216 may include a hole with keyways 1104 oriented at different angles to each other, e.g., two keyways 1104 occupying planes perpendicular to each other, such that partition 216 may be placed over keyed routing post 1102 in one orientation and/or may be rotated 90° (or some other predetermined angle) to engage the same keyed routing post 1102 in a second orientation different than the first orientation. Accordingly, partition 216 may have an axis of rotation that is centrally located within wiring bay 302 to allow partition 216 to be rotated from a first position in which it extends from the rotation of axis toward a right side of wiring bay 302 to a second position in which it extends from the rotation of axis toward a left side of wiring bay 302. The versatility of barrier and the ability to quickly relocate barrier as needed within wiring bay 302 allows an installer to reconfigure wiring paths within seconds.

Figure 12:
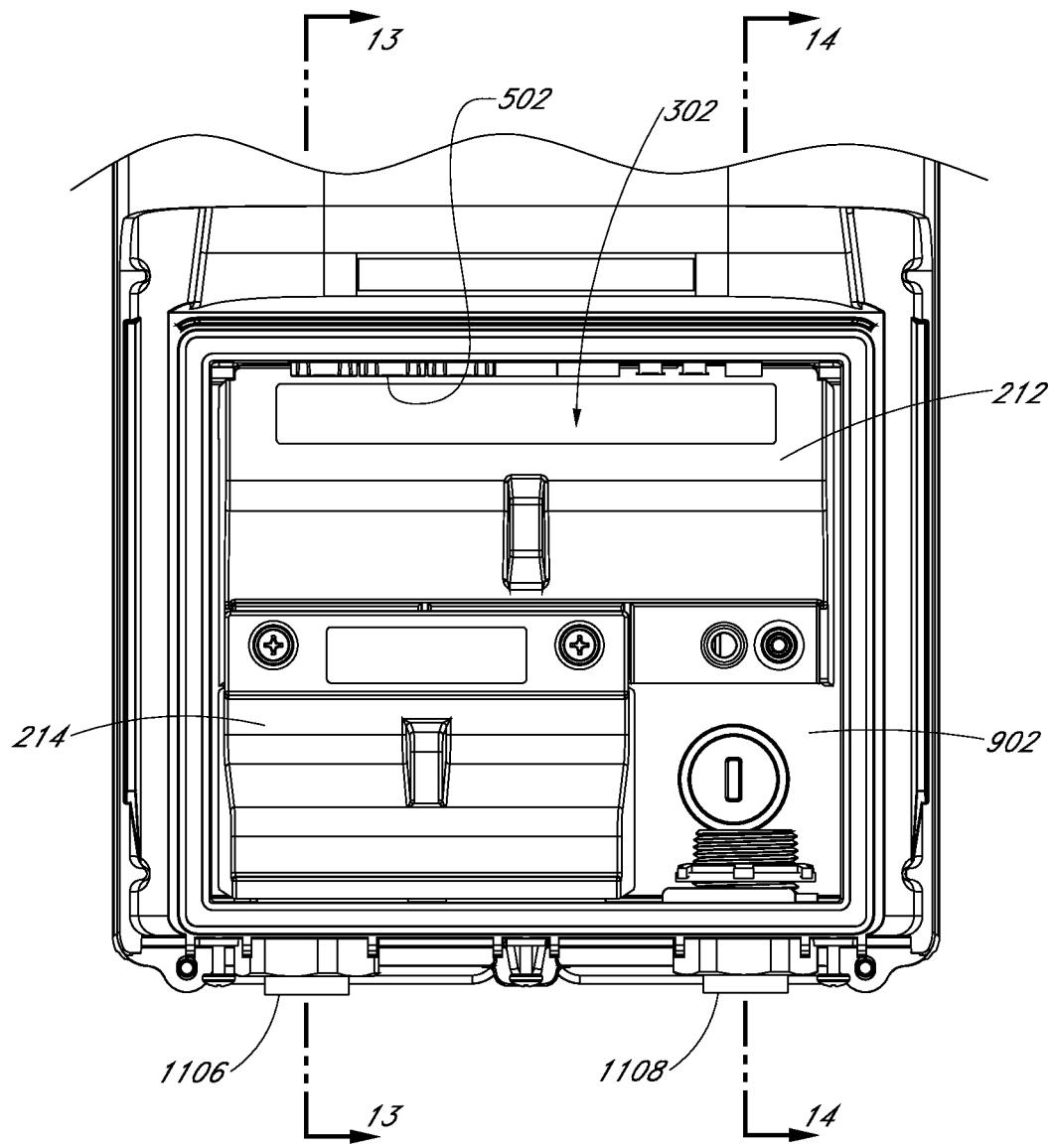
FIG. 12 illustrates a front view of an enclosure having a modular shroud mounted on a main shroud in a first location to create a lateral compartment leftward of an adjacent compartment, in accordance with an embodiment of the present disclosure.

Referring to FIG. 12, a front view of an enclosure having a modular shroud mounted on a main shroud in a first mounting location to create a lateral compartment having a first position relative to, e.g., leftward of, an adjacent compartment is illustrated in accordance with an embodiment of the present disclosure. In an embodiment, main shroud 212 is located in an upper portion of wiring bay 302, modular shroud 214 is located adjacent to and/or mounted on a lower left portion of main shroud 212, and partition 216 is located between a lower right portion of main shroud 212 and a rear surface of wiring bay 302 above an adjacent compartment 902. Accordingly, low-voltage electrical connectors 502 may be arranged along an upper boundary of wiring bay 302 in front of main shroud 212. Thus, low-voltage wiring may extend from low-voltage electrical connectors 502 in front of main shroud 212 and outside of lateral compartment, which is hidden behind modular shroud 214, to low-voltage cable opening 1108 in housing 102, which serves as an egress point from adjacent compartment 902 to a surrounding environment. Furthermore, high-voltage wiring may extend from high-voltage electrical connectors 504 behind main shroud 212 through the rear compartment behind main shroud 212 and the lateral compartment behind modular shroud 214 to high-voltage voltage cable opening 1106 in housing 102. Since low-voltage wiring runs in front of the shrouds and high-voltage wiring runs behind the shrouds, and because partition 216 and modular lateral wall 804 separate adjacent compartment 902 from the compartments behind the shrouds, high-voltage and low-voltage wiring may cross over each other from one side of wiring bay 302 to another while maintaining physical separation between the wiring. Furthermore, since the wiring can cross at almost any point between the electrical connectors 304 and the cable openings 112, the entire height and width of wiring bay 302 may be utilized for routing the wires, and thus, the wiring need not be bent sharply (as may be necessary in the case of a fixed routing path).

Figure 13:
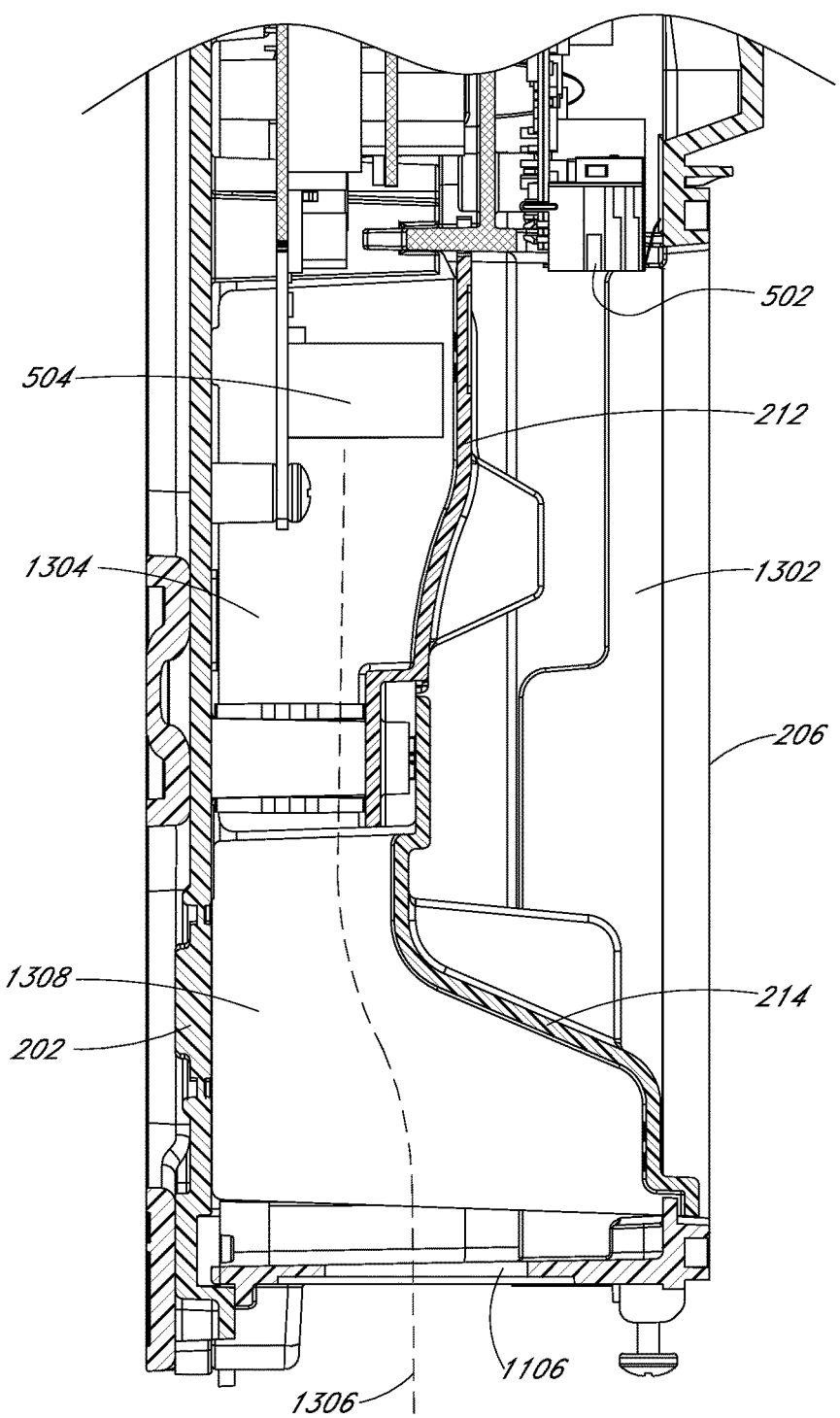
FIG. 13 illustrates a sectional view, taken about line B-B of FIG. 12, of a high-voltage wiring path extending from a high-voltage electrical connector to a high-voltage cable opening, in accordance with an embodiment of the present disclosure.

Referring to FIG. 13, a sectional view, taken about line B-B of FIG. 12, of a high-voltage wiring path extending from a high-voltage electrical connector to a high-voltage cable opening is illustrated in accordance with an embodiment of the present disclosure. A front compartment 1302 may be defined as being in front of main shroud 212 and modular shroud 214, between the shrouds and front opening 206 (or access panel 114 covering front opening 206). Front compartment 1302 may also extend between low-voltage electrical connectors 502 and a bottom surface of wiring bay 302. Furthermore, a rear compartment 1304 may be defined as being behind main shroud 212, between main shroud 212 and a rear surface of wiring bay 302. Rear compartment 1304 may also extend between high-voltage electrical connectors 504 and the bottom surface of wiring bay 302. Thus, in an embodiment, a high-voltage wiring path 1306 extends from high-voltage electrical connectors 504 to a high-voltage cable opening 1106 through rear compartment 1304. The rear space behind the reconfigurable shrouds may be further divided by way of definition into rear compartment 1304 behind main shroud 212 and a lateral compartment 1308 behind modular shroud 214. Thus, high-voltage wiring path 1306 may also extend through lateral compartment 1308 behind modular shroud 214 to high-voltage cable opening 1106. Accordingly, main shroud 212 and modular shroud 214 may isolate the high-voltage wiring path 1306 from a low-voltage wiring path in front of the shrouds. It should be stated for the sake of completeness that high-voltage wiring path 1306 may also exit wiring bay 302 through base 202 or lateral wall 110 of housing 102, and in addition, some high-voltage wires may pass through high-voltage cable opening 1106 in bottom wall 106 (as shown)

and some high-voltage wires may pass through another cable opening 112 in another wall of housing 102.

Figure 14:
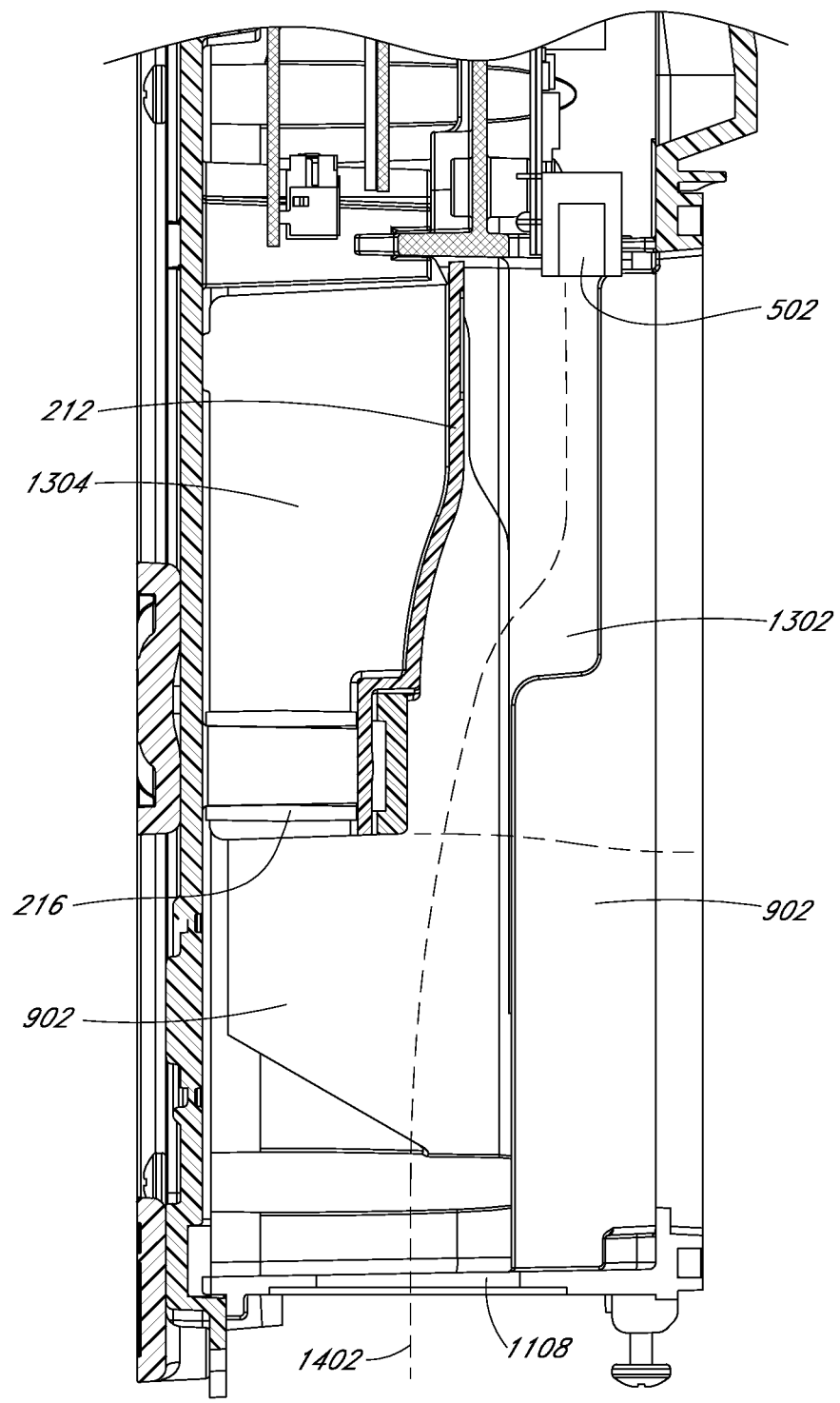
FIG. 14 illustrates a sectional view, taken about line C-C of FIG. 12, of a low-voltage wiring path extending from a low-voltage electrical connector to a low-voltage cable opening, in accordance with an embodiment of the present disclosure.

Referring to FIG. 14, a sectional view, taken about line C-C of FIG. 12, of a low-voltage wiring path extending from a low-voltage electrical connector to a low-voltage cable opening is illustrated in accordance with an embodiment of the present disclosure. As in the cross-sectional view taken through main shroud 212 and modular shroud 214 (FIG. 13) front compartment 1302 may be defined as being in front of main shroud 212 and rear compartment 1304 may be defined as being behind main shroud 212. Adjacent compartment 902, however, may be considered to occupy a space both in front of main shroud 212 and behind main shroud 212, albeit offset below a bottom edge of main shroud 212. More particularly, a reference plane extending upward from the bottom edge of main shroud 212 toward front opening 206 may provide an imaginary boundary between front compartment 1302 and adjacent compartment 902, while partition 216 extending between main shroud 212 and a rear surface of wiring bay 302 may provide a physical boundary between rear compartment 1304 and adjacent compartment 902. Thus, a low-voltage wiring path 1402 may extend from low-voltage electrical connector 502 in front of main shroud 212 through front compartment 1302 and adjacent compartment 902 into low-voltage cable opening 1108. Accordingly, main shroud 212 and partition 216 may isolate the low-voltage wiring path 1402 from a high-voltage wiring path behind another side of the shrouds and partition.

Figure 15:
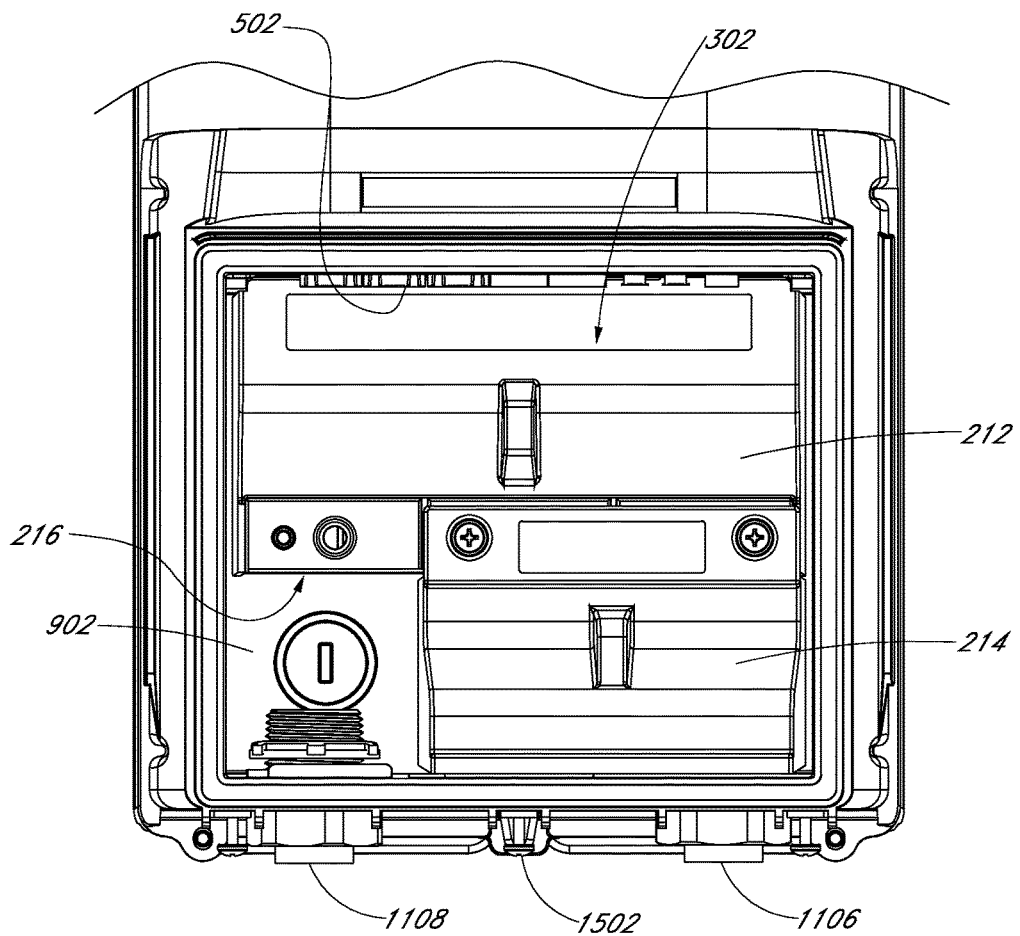
FIG. 15 illustrates a front view of an enclosure having a modular shroud mounted on a main shroud in a second location to create a lateral compartment rightward of an adjacent compartment, in accordance with an embodiment of the present disclosure.

Referring to FIG. 15, a front view of an enclosure having a modular shroud mounted on a main shroud in a second mounting location to create a lateral compartment having a second position relative to, e.g., rightward of, an adjacent compartment is illustrated in accordance with an embodiment of the present disclosure. In an embodiment, modular shroud 214 is located adjacent to and/or mounted on a lower right portion of main shroud 212, and partition 216 is located between a lower left portion of main shroud 212 and a rear surface of wiring bay 302 above adjacent compartment 902. Accordingly, low-voltage wiring may extend from low-voltage electrical connectors 502 in front of main shroud 212 and outside of lateral compartment 1308, which is hidden behind modular shroud 214, to low-voltage cable opening 1108 in housing 102, which serves as an egress point from adjacent compartment 902 to a surrounding environment. Furthermore, high-voltage wiring may extend from high-voltage electrical connectors 504 behind main shroud 212 through the rear compartment 1304 behind main shroud 212 and the lateral compartment 1308 behind modular shroud 214 to high-voltage cable opening 1106 in housing 102. Accordingly, by rearranging the locations within wiring bay 302 at which modular shroud 214 and partition 216 are located, high-voltage and low-voltage wiring may be separately routed through different egress points in housing 102 to avoid having to cross the wiring conduits outside of enclosure 100. The high-voltage wiring and low-voltage wiring may be isolated from each other by main shroud 212, modular shroud 214, and partition 216.

As discussed above, relocating modular shroud 214 may open lateral compartment 1308 to different cable openings 112, e.g., a rightward or leftward cable opening 112. It will be appreciated, however, that enclosure 100 may include at least one egress point that remains accessible from lateral compartment 1308 regardless of a location of modular shroud 214. For example, a common cable opening 1502 may be located in a wall of housing 102, e.g., in bottom wall 106 between high-voltage cable opening 1106 and low-voltage cable opening 1108, and modular shroud 214 may be wide enough that lateral compartment 1308 behind modular shroud 214 remains open to common cable opening 1502 regardless of where modular shroud 214 is mounted (see FIGS. 12 and 15).

Having discussed the modularity of barrier components located in wiring bay 302, the spatial and structural relationships between the modular compartments and other components of enclosure 100 may now be discussed. In an embodiment, enclosure 100 includes tray 210 disposed in circuitry bay 402 and having several structural features to allow for mounting of one or more PCBs and one or more antennas.

Figure 16:
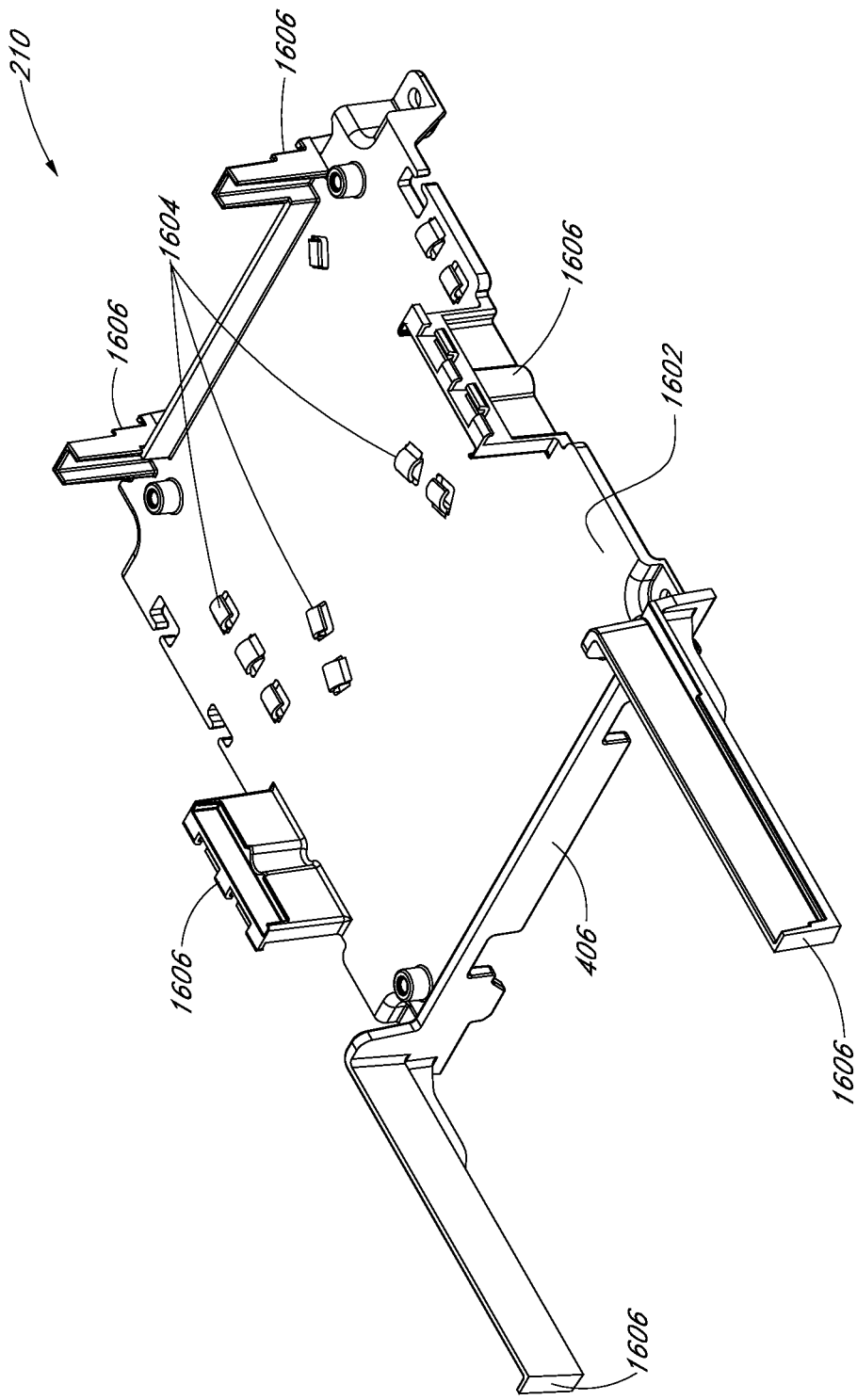
FIG. 16 illustrates a perspective view of a tray having antenna mounts, in accordance with an embodiment of the present disclosure.

Referring to FIG. 16, a perspective view of a tray having antenna mounts is illustrated in accordance with an embodiment of the present disclosure. Tray 210 may include a planar structure, such as a plate having a front face 1602 on which one or more electrical or electronic components, such as PCBs, may be mounted. Furthermore, the plate may include various mounting points, not only for PCBs, but for other electrical or electronic components such as wiring or cables. More particularly, one or more cable holders 1604 may be attached or integrally formed in the plate, e.g., by punching and bending a piece of plate material into a hook shape, to grasp cables and direct them along the plate. Tray 210 may also include several antenna mounts 1606 cantilevered from the plate to hold various antennas at respective locations and orientations relative to front face 1602. The antenna mounts 1606 may be wholly or partially contained within circuitry bay 402.

In an embodiment, some portions of tray 210 delimit circuitry bay 402 and/or wiring bay 302. For example, barrier wall 406 may be located along a bottom edge of front face 1602 such that a bottom face of barrier wall 406 faces wiring bay 302 to form an upper boundary of wiring bay 302. The bottom face of barrier wall 406 may be deeper in a front to back direction than the plate of tray 210. More particularly, the plate may be thinner than barrier wall 406 is deep. Thus, barrier wall 406 may block access from wiring bay 302 into circuitry bay 402 in front of and/or behind front face 1602 of tray 210. Accordingly, barrier wall 406 may separate circuitry bay 402 from wiring bay 302 to inhibit access to circuitry bay 402 (a non-field serviceable zone) through wiring bay 302 (a field-serviceable zone) when front wall 108 of housing 102 is attached to base 202.

Figure 17:
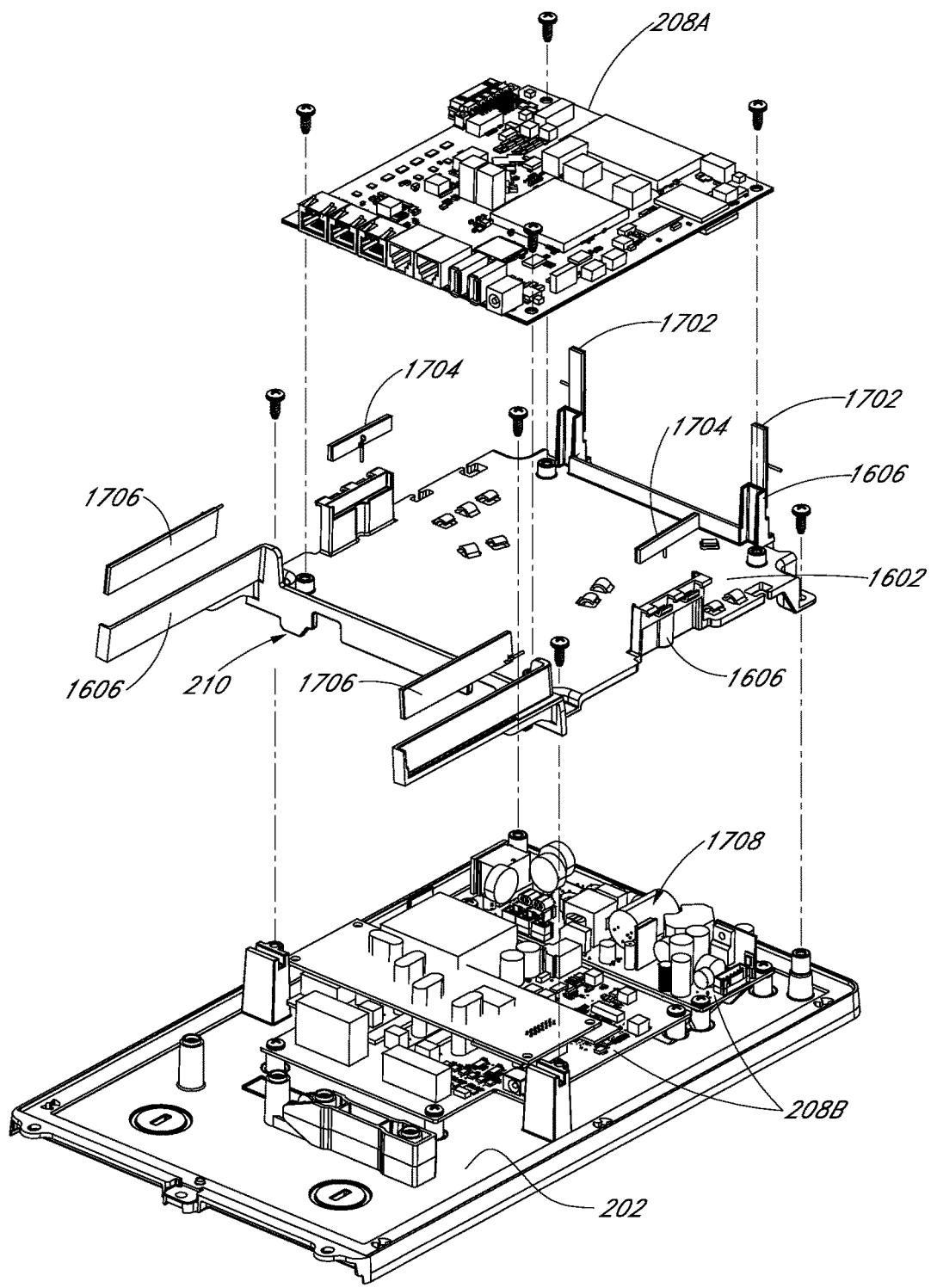
FIG. 17 illustrates an exploded view of a tray for supporting a printed circuit board and several antennas within a circuitry bay of an enclosure, in accordance with an embodiment of the present disclosure.

Referring to FIG. 17, an exploded view of a tray for supporting a printed circuit board and several antennas within a circuitry bay of an enclosure is illustrated in accordance with an embodiment of the present disclosure. Tray 210 may provide a mounting surface for components within both circuitry bay 402 and wiring bay 302. For example, a first PCB 208A may be mounted on front face 1602 of tray 210 within circuitry bay 402. The first PCB 208A may be attached to front face 1602 using fasteners such as screws, snaps, adhesive joints, etc. The first PCB 208A may also be offset from front face 1602 by mounting brackets 218 or posts providing a gap between the first PCB 208A and front face 1602. Cables may be routed through the cable holders 1604 within the gap. Therefore, wiring may be routed from the first PCB 208A to other components within circuitry bay 402. For example, coaxial cabling may be routed from the first PCB 208A to the antennas mounted on tray 210.

One or more additional PCBs 208 may also be located within circuitry bay 402. For example, one or more second PCBs 208B may be mounted on a rear surface of circuitry bay 402 behind tray 210. More particularly, a second PCB 208B may be directly behind the first PCB 208A, i.e., the first PCB 208A may be stacked in front of the second PCB 208B. Accordingly, the first PCB 208A may be mounted on tray 210 in a first manufacturing operation, and then the tray/PCB subassembly may be subsequently mounted over the second PCB 208B in a second manufacturing operation. This not only speeds manufacturing, but also allows the first PCB 208A and the second PCB 208B to be stacked along a same axis rather than being spread out laterally within a same plane. Accordingly, a footprint of enclosure 100 may be correspondingly reduced to provide a compact form factor.

In an embodiment, the first PCB 208A and the second PCB 208B may be mounted on tray 210. For example, the first PCB 208A may be mounted on front face 1602, and the second PCB 208B may be mounted on a rear face of tray 210 behind front face 1602. Thus, tray 210 allows multiple PCBs 208 to be preassembled in a stacked configuration and then mounted to base 202 of enclosure 100 in a single manufacturing operation.

Several different kinds of antennas may be mounted on tray 210. For example, the antennas may include one or more Wi-Fi antennas 1702, one or more ZigBee antennas 1704, and one or more cellular antennas 1706 to allow communication with external devices located within different communication ranges. In an embodiment, the antennas are arranged in pairs and are located/oriented to maximize an antenna signal for optimal communication. For example, Wi-Fi antennas 1702 may be attached to antenna mounts 1606 located along a top edge of front face 1602. The antenna mounts 1606 may be oriented such that Wi-Fi antennas 1702 are cantilevered in a forward direction to extend from front face 1602 toward front wall 108, occupying space between front face 1602 and front wall 108. ZigBee antennas 1704 may be attached to antenna mounts 1606 located along respective lateral edges of front face 1602. The antenna mounts 1606 may be oriented such that ZigBee antennas 1704 are offset in a forward direction from front face 1602 and have longitudinal axes parallel to front face 1602. Thus, Wi-Fi antennas 1702 and ZigBee antennas 1704 may be located within circuitry bay 402. Cellular antennas 1706, however, may be at least partially contained by wiring bay 302.

Tray 210 may include antenna mounts 1606 extending into wiring bay 302. For example, antenna mounts 1606 holding cellular antennas 1706 may have first ends attached to barrier wall 406 and may extend downward to second ends nearer to bottom wall 106 of housing 102. Accordingly, cellular antennas 1706 may be mounted on respective antenna mounts 1606 laterally outward from a portion of wiring bay 302 having main shroud 212 and modular shroud 214. Cellular antennas 1706 may be mounted on respective antenna mounts 1606 between the antenna mounts 1606 and respective lateral walls 110 of housing 102. In an embodiment, antenna mounts 1606 holding cellular antennas 1706 extend into wiring bay 302 such that the attachment surfaces on antenna mounts 1606 are parallel to side surfaces of wiring bay 302, and thus, longitudinal axes of cellular antennas 1706 may also be parallel to the side surfaces.

It is contemplated that communication signals between antennas of enclosure 100 and external devices may be improved by mounting the antennas within a predetermined distance from the enclosure 100 walls. In an embodiment, cellular antennas 1706, ZigBee antennas 1704, or Wi-Fi antennas 1702 disposed within enclosure 100 are located within 0.5 inch from a nearest wall of the enclosure. For example, cellular antennas 1706 may be mounted 6-10 mm from an inside surface of lateral walls 110, ZigBee antennas 1704 may be mounted 8-12 mm from an inside surface of lateral walls 110, and Wi-Fi antennas 1702 may be mounted 7-11 mm from an inside surface of top wall 104.

The antenna mounts 1606 may be located to isolate the respective antennas from electromagnetic interference (EMI). More particularly, the plate of tray 210 may be located between each antenna and a power supply 1708 mounted within circuitry bay 402 behind tray 210. In an embodiment, power supply 1708 may receive power from the second PCB 208B, which may be a power manager PCB used to deliver power to the first PCB 208A mounted above the second PCB 208B. The location of tray 210 between power supply 1708 and the antennas may attenuate radiofrequency waves generated by power supply 1708 to inhibit EMI. Accordingly, the first PCB 208A, which may be a monitoring system PCB intended to process antenna and communications data, may be electrically isolated from power supply 1708 by tray 210. Furthermore, antenna mounts 1606 may be positioned on tray 210 such that their distance from power supply 1708 affords some degree of protection against EMI. For example, Wi-Fi antenna 1702, ZigBee antenna 1704, and cellular antenna 1706 may be located at least 0.5 inch from power supply 1708 within enclosure 100.

Figure 18:
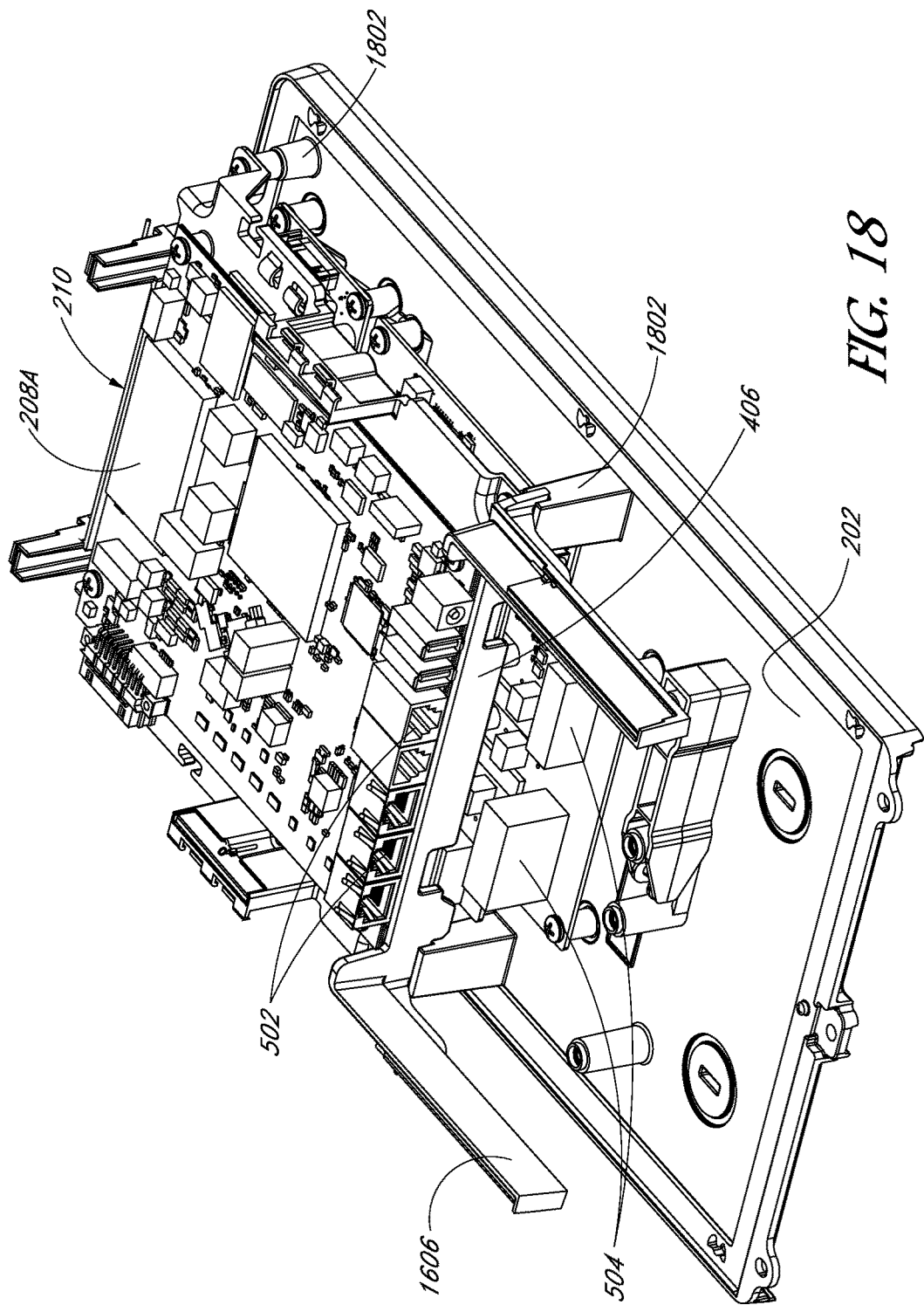
FIG. 18 illustrates a perspective view of a tray supporting a printed circuit board and several antennas within a circuitry bay of an enclosure, in accordance with an embodiment of the present disclosure.

Referring to FIG. 18, a perspective view of a tray supporting a printed circuit board and several antennas within a circuitry bay of an enclosure is illustrated in accordance with an embodiment of the present disclosure. When tray 210 is coupled with base 202, e.g., by dropping tray 210 down onto mounting bosses 1802, PCB 208A may be located in circuitry bay 402 and separated from wiring bay 302 by low-voltage electrical connectors 502 and/or barrier wall 406 arranged along an upper boundary of wiring bay 302. As shown and discussed above, high-voltage electrical connectors 504 may be located within wiring bay 302, and may also block access from wiring bay 302 into circuitry bay 402 behind tray 210. Thus, the upper boundary of wiring bay 302 may be formed by low-voltage electrical connectors 502, barrier wall 406, and high-voltage electrical connectors 504 located between wiring bay 302 and circuitry bay 402.

In an embodiment, several antenna mounts 1606 of tray 210 extend from the upper boundary of wiring bay 302 and/or circuitry bay 402 into wiring bay 302 along lateral walls 110 of housing 102. Thus, the cantilevered antenna mounts 1606 within wiring bay 302 may be spaced apart from each other as much as possible to allow an installer to access wiring bay 302 without being blocked by the antenna mounts 1606. For example, the antenna mounts 1606 may be separated by a distance at least as wide as main shroud 212 width to ensure that main shroud 212 may be inserted into and removed from the space between the antenna mounts 1606. For example, lateral walls 110 of housing 102 may taper inward as they extend from base 202 to front opening 206, and thus, pockets may be created within wiring bay 302 laterally outward of front opening 206. Antenna mounts 1606 may extend into the pockets in wiring bay 302. Accordingly, the distance between the antenna mounts 1606 may be greater than a width of front opening 206 such that, when front opening 206 is viewed from the front, antenna mounts 1606 are not visible. More particularly, the cantilevered antenna mount configuration may keep the field serviceable zone open for access. As a result, main shroud 212 and/or modular shroud 214 may be placed laterally between the antenna mounts 1606.

Figure 19:
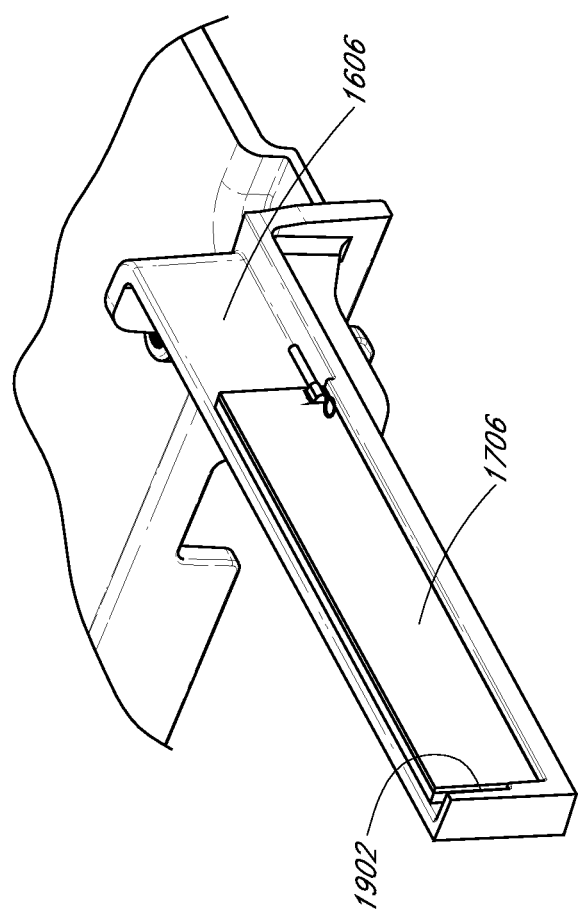
FIG. 19 illustrates a partial perspective view of a tray having an antenna mounted on an antenna mount, in accordance with an embodiment of the present disclosure.

Referring to FIG. 19, a partial perspective view of a tray having an antenna mounted on an antenna mount is illustrated in accordance with an embodiment of the present disclosure. Antennas such as Wi-Fi antennas 1702, ZigBee antennas 1704, and cellular antennas 1706 may be attached to antenna mounts 1606 in numerous manners. For example, cellular antenna 1706 may be fixed to a mounting surface of antenna mount 1606 by an adhesive joint, such as by an adhesive backing having a thickness between 1-3 mm, e.g., 1.6 mm. Occasionally, however, environmental aging of the adhesive could lead to joint failure, and thus, antenna mounts 1606 may also include structural features to retain cellular antenna 1706 even when the adhesive fails. For example, antenna mount 1606 may include an antenna pocket 1902 within which cellular antenna 1706 is mounted. Antenna pocket 1902 may include grooves formed in antenna mount 1606, and the grooves may be wider than cellular antenna 1706 is thick. Thus, the cellular antenna 1706 may be slotted into the groove. Cellular antenna 1706 may then rest on a bottom end of antenna mount 1606 such that gravity retains cellular antenna 1706 within the grooves and reduces the likelihood that the antennas will fall out of place even when an adhesive joint fails.

The enclosure components described above may be fabricated from materials that are best suited to their purpose. For example, given that main shroud 212, modular shroud 214, and partition 216 are intended to provide reconfigurable wiring compartments that physically and electrically separate high-voltage wiring from low-voltage wiring, it is contemplated that main shroud 212, modular shroud 214, and partition 216 may be formed from dielectric materials. In an embodiment, main shroud 212, modular shroud 214, and partition 216 are fabricated from polycarbonate.

Figure 20:
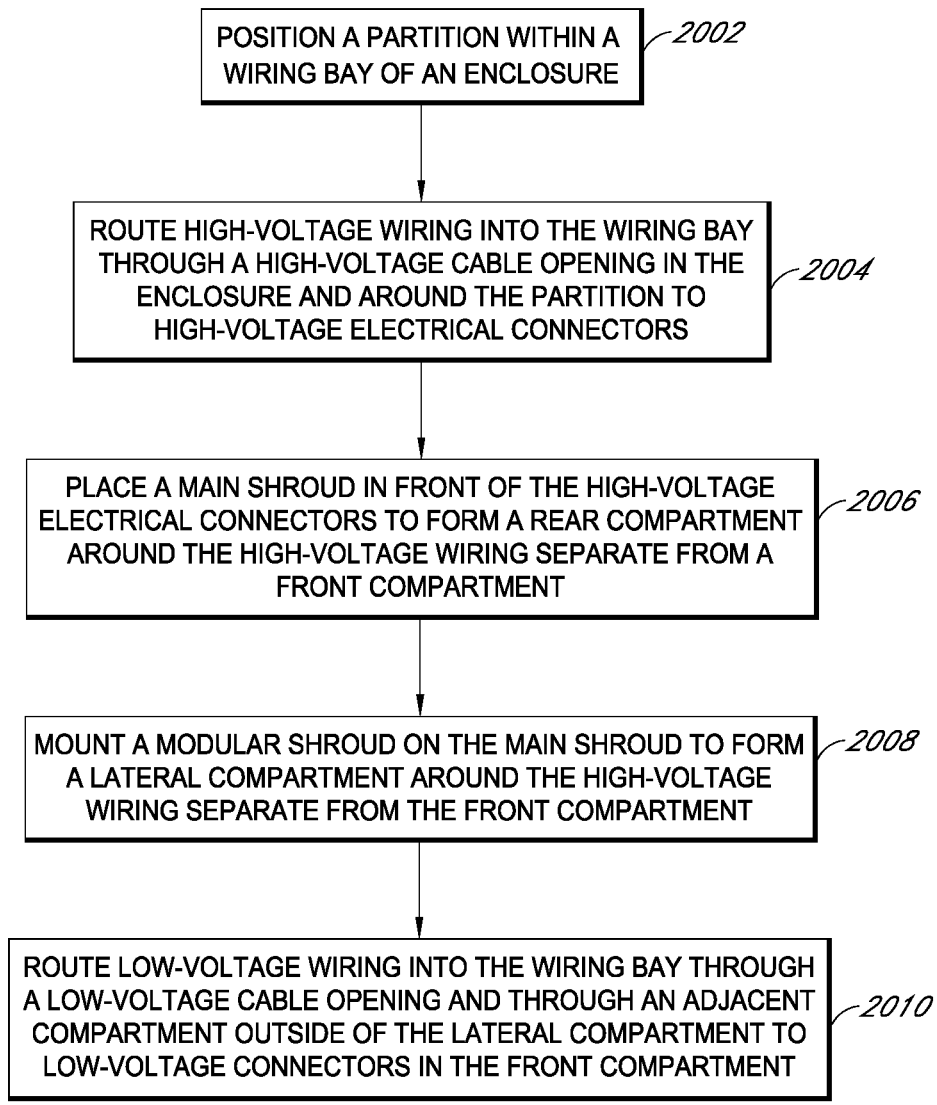
FIG. 20 illustrates a flowchart of a method of configuring wiring compartments in a wiring bay, in accordance with an embodiment of the present disclosure.

Referring to FIG. 20, a flowchart of a method of configuring wiring compartments in a wiring bay is illustrated in accordance with an embodiment of the present disclosure. At operation 2002, an installer decides how high-voltage wiring is to be routed and locates partition 216 accordingly. More particularly, if the installer plans to route high-voltage wiring through a rightward cable opening 112 in enclosure 100, partition 216 may be located on a leftward side of wiring bay 302. The installer may configure partition 216 as described above, for example by swinging partition 216 into place about hinge 1004, or by sliding, picking and placing, or otherwise locating partition 216 within wiring bay 302. Thus, partition 216 may be positioned to block access to the high-voltage zone at the completion of the installation process.

At operation 2004, high-voltage wiring may be routed into wiring bay 302 through the designated cable opening 112. For example, if the installer decided to route high-voltage wiring through the rightward cable opening 112 in enclosure 100, high-voltage wiring may be routed through the high-voltage cable opening 1106 on a right side of wiring bay 302. The high-voltage wiring may further be pulled upward and around partition 216, and through wiring bay 302, to high-voltage electrical connectors 504. The high-voltage wiring may then be connected to high-voltage electrical connectors 504 such that high-voltage wiring extends from high-voltage electrical connectors 504 downward and around partition 216 to exit wiring bay 302 through high-voltage cable opening 1106 of enclosure 100.

At operation 2006, main shroud 212 may be placed in wiring bay 302 over the already-connected high-voltage wiring. Main shroud 212 may be located in front of high-voltage electrical connectors 504 to form rear compartment 1304 around an upper length of high-voltage wiring behind main front wall 702. More particularly, main shroud 212 may separate the high-voltage wiring in rear compartment 1304 from front compartment 1302 in front of main shroud 212.

At operation 2008, modular shroud 214 may be placed in wiring bay 302 and positioned to form lateral compartment 1308. For example, modular shroud 214 may be mounted on main shroud 212 to form lateral compartment 1308 around a lower length of the high-voltage wiring below main shroud 212. Thus, when modular shroud 214 is mounted on main shroud 212 (or adjacent to main shroud 212 on appropriately located mounts in wiring bay 302) the high-voltage wiring within lateral compartment 1308 is separated from front compartment 1302.

At operation 2010, low-voltage wiring may be routed into wiring bay 302 through another cable opening 112. That is, the low-voltage wiring may be inserted through low-voltage cable opening 1108 located to the left of high-voltage cable opening 1106. Low-voltage cable opening 1108 may also be below partition 216 such that, when the low-voltage wiring is inserted into wiring bay 302, the wiring passes through adjacent compartment 902 outside of lateral compartment 1308 and below rear compartment 1304. The low-voltage wiring may then be pulled upward and over main shroud 212 to low-voltage connectors in front compartment 1302. The low-voltage wiring may also be connected to low-voltage connectors. Thus, the low-voltage wiring may be isolated from the high-voltage wiring by main shroud 212, modular shroud 214, and partition 216. The installer may cover front opening 206 with access panel 114 to complete the installation.

Thus, enclosures having reconfigurable wiring compartments for separately routing high-voltage and low-voltage wiring have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An enclosure, comprising:
 a housing around a circuitry bay and a wiring bay, wherein the housing includes a front wall covering the circuitry bay and a front opening over the wiring bay;
 a first shroud disposed in the wiring bay, wherein the first shroud separates a front compartment of the wiring bay from a rear compartment of the wiring bay;
 a second shroud disposed in the wiring bay, wherein the second shroud is configured to mount on the first shroud in a plurality of locations, and wherein the second shroud separates a lateral compartment of the wiring bay from an adjacent compartment of the wiring bay; and
a partition disposed in the wiring bay, wherein the partition is configured to move between a first location and a second location to separate the rear compartment from the adjacent compartment.

2. The enclosure of claim 1, wherein the second shroud is configured to move from a first mounting location on the first shroud to a second mounting location on the first shroud, wherein the lateral compartment has a first position relative to the adjacent compartment when the second shroud is at the first mounting location, and wherein the lateral compartment has a second position relative to the adjacent compartment when the second shroud is at the second mounting location.

3. The enclosure of claim 2 further comprising:
a plurality of high-voltage electrical connectors between the circuitry bay and the wiring bay; and
a plurality of low-voltage electrical connectors between the circuitry bay and the wiring bay, wherein a first distance between the low-voltage electrical connectors and the front opening is less than a second distance between the high-voltage electrical connectors and the front opening.

4. The enclosure of claim 3 further comprising:
a high-voltage wiring path extending from the high-voltage electrical connectors through the rear compartment and the lateral compartment to a high-voltage cable opening in the housing; and
a low-voltage wiring path extending from the low-voltage electrical connectors through the front compartment and the adjacent compartment to a low-voltage cable opening;
wherein the first shroud, the second shroud, and the partition isolate the high-voltage wiring path from the low-voltage wiring path.

5. The enclosure of claim 4, wherein the partition is hinged to a base of the housing such that the partition swings between the first location and the second location.

6. The enclosure of claim 1, further comprising:
a tray disposed within the circuitry bay;
a first electronic component mounted on the tray; and
a second electronic component mounted within the circuitry bay, wherein the tray separates the first electronic component from the second electronic component.

7. The enclosure of claim 6, wherein the first electronic component is coupled to a first printed circuit board (PCB) mounted on the tray, and wherein the second electronic component is coupled to a second PCB mounted on the housing.

8. The enclosure of claim 6, wherein the tray includes an antenna mount extending into the wiring bay.

9. An enclosure, comprising:
a housing around a circuitry bay and a wiring bay, wherein the housing includes a front wall covering the circuitry bay and a front opening over the wiring bay;
a first shroud disposed in the wiring bay, wherein the first shroud separates a front compartment of the wiring bay from a rear compartment of the wiring bay;
a second shroud disposed in the wiring bay, wherein the second shroud is configured to mount in a plurality of locations within the wiring bay, and wherein the second shroud separates a lateral compartment of the wiring bay from an adjacent compartment of the wiring bay; and
a tray disposed in the circuitry bay.

10. The enclosure of claim 9, wherein the second shroud is configured to move from a first mounting location within the wiring bay to a second mounting location within the wiring bay, wherein the lateral compartment has a first position relative to the adjacent compartment when the second shroud is at the first mounting location, and wherein the lateral compartment has a second position relative to the adjacent compartment when the second shroud is at the second mounting location.

11. The enclosure of claim 10, further comprising:
a plurality of high-voltage electrical connectors between the circuitry bay and the wiring bay; and
a plurality of low-voltage electrical connectors between the circuitry bay and the wiring bay, wherein a first distance between the low-voltage electrical connectors and the front opening is less than a second distance between the high-voltage electrical connectors and the front opening.

12. The enclosure of claim 11, further comprising:
a high-voltage wiring path extending from the high-voltage electrical connectors through the rear compartment and the lateral compartment to a high-voltage cable opening in the housing; and
a low-voltage wiring path extending from the low-voltage electrical connectors through the front compartment and the adjacent compartment to a low-voltage cable opening;
wherein the first shroud and the second shroud isolate the high-voltage wiring path from the low-voltage wiring path.

13. The enclosure of claim 12, wherein the tray includes an antenna mount extending into the wiring bay.

14. The enclosure of claim 13, wherein an antenna is mounted on the antenna mount between the antenna mount and the housing.

15. The enclosure of claim 9 further comprising:
a first electronic component mounted on the tray; and
a second electronic component mounted within the circuitry bay, wherein the tray separates the first electronic component from the second electronic component.

16. The enclosure of claim 15, wherein the first electronic component is coupled to a first printed circuit board (PCB) mounted on the tray and the second electronic component is coupled to a second PCB mounted on the housing.

17. An enclosure, comprising:
a housing around a circuitry bay and a wiring bay, wherein the housing includes a front opening over the wiring bay;
a plurality of electrical connectors disposed between the circuitry bay and the wiring bay and accessible through the front opening, wherein the plurality of electrical connectors includes a high-voltage electrical connector and a low-voltage electrical connector;
a first shroud disposed in the wiring bay, wherein the first shroud separates the high-voltage electrical connector from the low-voltage electrical connector; and
a second shroud disposed in the wiring bay, wherein the second shroud is configured to move between a plurality of locations within the wiring bay to adjust a position of a lateral compartment, and wherein a high-voltage wiring path extends from the high-voltage electrical connector behind the first shroud and through the lateral compartment to a high-voltage cable opening in the housing.

18. The enclosure of claim 17, wherein a low-voltage wiring path extends from the low-voltage electrical connector in front of the first shroud and outside of the lateral compartment to a low-voltage cable opening in the housing.

19. The enclosure of claim 18 further comprising a tray disposed within the circuitry bay between the high-voltage electrical connector and the low-voltage electrical connector, the tray having a barrier wall separating the circuitry bay from the wiring bay.

20. The enclosure of claim 19, further comprising:
 a first electronic component mounted on the tray; and
 a second electronic component mounted within the circuitry bay, wherein the tray separates the first electronic component from the second electronic component.

* * * * *